(12) United States Patent
Fattal

(10) Patent No.: US 11,804,188 B2
(45) Date of Patent: Oct. 31, 2023

(54) MODE-SWITCHABLE BACKLIGHT, PRIVACY DISPLAY, AND METHOD EMPLOYING EMITTER ARRAYS

(71) Applicant: LEIA INC., Menlo Park, CA (US)

(72) Inventor: David A. Fattal, Menlo Park, CA (US)

(73) Assignee: LEIA INC., Menlo Park, CA (US)

( * ) Notice: Subject to any disclaimer, the term of this patent is extended or adjusted under 35 U.S.C. 154(b) by 159 days.

(21) Appl. No.: 17/460,021

(22) Filed: Aug. 27, 2021

(65) Prior Publication Data

US 2021/0390914 A1 Dec. 16, 2021

Related U.S. Application Data

(63) Continuation of application No. PCT/US2019/061882, filed on Nov. 15, 2019.
(Continued)

(51) Int. Cl.
*G09G 3/34* (2006.01)
*G02F 1/1335* (2006.01)
*G02F 1/13* (2006.01)

(52) U.S. Cl.
CPC .......... *G09G 3/342* (2013.01); *G02F 1/1323* (2013.01); *G02F 1/133607* (2021.01); *G09G 2358/00* (2013.01)

(58) Field of Classification Search
CPC . G02F 1/1323; G02F 1/133607; G09G 3/342; G09G 2358/00
See application file for complete search history.

(56) References Cited

U.S. PATENT DOCUMENTS 9,128,226 B2 9/2015 Fattal et al.
9,201,270 B2 12/2015 Fattal et al.
(Continued)

FOREIGN PATENT DOCUMENTS

JP 2008096765 A 4/2008
KR 10-0853594 B1 8/2008
(Continued)

OTHER PUBLICATIONS

Fattal, David et al., "A multi-directional backlight for a wide-angle, glasses-free three-dimensional display," Nature, Mar. 21, 2013, pp. 348-351, vol. 495, Macmillan Publishers Limited, 2013.
(Continued)

*Primary Examiner* — Kevin M Nguyen
(74) *Attorney, Agent, or Firm* — J. Michael Johnson

(57) ABSTRACT

A mode-switchable backlight and privacy display provide narrow-angle emitted light during a first mode and broad-angle emitted light in a second mode, the broad-angle emitted light being a combination of the narrow-angle emitted light and bidirectional emitted light. The mode-switchable backlight includes a first directional backlight and a second directional backlight. The first directional backlight includes an array of narrow-angle emitters configured to provide the narrow-angle emitted light during both of the first mode and second mode, while the second directional backlight includes an array of bidirectional emitters configured to provide the bidirectional emitted light exclusively during the second mode. The mode-switchable privacy display includes an array of light valves configured to modulate the narrow-angle emitted light during the first mode and to modulate broad-angle emitted light during the second mode.

13 Claims, 7 Drawing Sheets

Related U.S. Application Data

(60) Provisional application No. 62/818,639, filed on Mar. 14, 2019.

(56) References Cited

U.S. PATENT DOCUMENTS

| | | | |
|---|---|---|---|
| 9,298,168 | B2 | 3/2016 | Taff et al. |
| 9,389,415 | B2 | 7/2016 | Fattal et al. |
| 9,459,461 | B2 | 10/2016 | Santori et al. |
| 9,557,466 | B2 | 1/2017 | Fattal |
| 9,785,119 | B2 | 10/2017 | Taff et al. |
| 10,345,505 | B2 | 7/2019 | Fattal |
| 10,551,546 | B2 | 2/2020 | Fattal |
| 10,649,128 | B2 | 5/2020 | Fattal et al. |
| 10,705,281 | B2 | 7/2020 | Fattal et al. |
| 10,798,371 | B2 | 10/2020 | Fattal |
| 10,802,212 | B2 | 10/2020 | Fattal |
| 10,802,443 | B2 | 10/2020 | Fattal |
| 10,810,917 | B2 | 10/2020 | Fattal |
| 10,830,939 | B2 | 11/2020 | Fattal et al. |
| 10,838,134 | B2 | 11/2020 | Fattal et al. |
| 10,884,175 | B2 | 1/2021 | Fattal |
| 10,928,564 | B2 | 2/2021 | Fattal |
| 10,928,677 | B2 | 2/2021 | Aieta et al. |
| 10,969,627 | B2 | 4/2021 | Fattal et al. |
| 11,004,407 | B2 | 5/2021 | Fattal et al. |
| 11,016,235 | B2 | 5/2021 | Fattal et al. |
| 11,041,988 | B2 | 6/2021 | Fattal et al. |
| 11,048,036 | B2 | 6/2021 | Ma et al. |
| 2007/0040780 | A1 | 2/2007 | Gass et al. |
| 2009/0322986 | A1 | 12/2009 | Wei et al. |
| 2012/0200807 | A1 | 8/2012 | Wei et al. |
| 2012/0235891 | A1* | 9/2012 | Nishitani ............. G02F 1/1323 345/102 |
| 2013/0169518 | A1 | 7/2013 | Wu et al. |
| 2014/0085570 | A1 | 3/2014 | Kuwata et al. |
| 2014/0160724 | A1 | 6/2014 | Lerman |
| 2015/0036068 | A1 | 2/2015 | Fattal et al. |
| 2017/0363794 | A1 | 12/2017 | Wan et al. |
| 2019/0017687 | A1 | 1/2019 | Zhang |
| 2019/0018186 | A1 | 1/2019 | Fattal |
| 2019/0302336 | A1 | 10/2019 | Fattal et al. |
| 2020/0005718 | A1 | 1/2020 | Fattal |
| 2020/0018891 | A1 | 1/2020 | Fattal et al. |
| 2020/0033526 | A1 | 1/2020 | Fattal et al. |
| 2020/0033621 | A1 | 1/2020 | Fattal et al. |
| 2020/0057343 | A1* | 2/2020 | Epstein ............. G02F 1/133615 |
| 2020/0301165 | A1 | 9/2020 | Fattal |
| 2020/0310135 | A1 | 10/2020 | Fattal |
| 2021/0157050 | A1 | 5/2021 | Fattal |

FOREIGN PATENT DOCUMENTS

| | | |
|---|---|---|
| WO | 2012038856 A1 | 3/2012 |
| WO | 2018182991 A1 | 10/2018 |
| WO | 2020190341 A1 | 9/2020 |
| WO | 2021076114 A1 | 4/2021 |

OTHER PUBLICATIONS

Kee, Edwin., "Hitachi Full Parallax 3D Display Offers Mind Bending Visuals," http://www.ubergizmo.com/2011/10/hitachi-full-parallax-3d-display-offers-mind-bending-visuals, Oct. 4, 2011, 2 pages.

Reichelt et al.,"Holographic 3-D Displays—Electro-holography within the Grasp of Commercialization," Advances in Lasers and Electro-Optics, Optics, Nelson Costa and Adolfo Cartaxo (Ed.), (2010), pp. 683-711, ISBN: 978-953-307-088-9, InTech, Available from: http://www.intechopen.com/books/advances-in-lasers-and-electro-optics/holographic-3-ddisplays-electro-holography-within-the-grasp-of-commercialization.

Travis et al., "Collimated light from a waveguide for a display backlight," Optics Express, Oct. 2009, pp. 19714-19719, vol. 17, No. 22.

Xu et al., "Computer-Generated Holography for Dynamic Display of 3D Objects with Full Parallax," International Journal of Virtual Reality, 2009, pp. 33-38, vol. 8, No. 2.

Son, Jung-Young et al., "Three-Dimensional Imaging Methods Based on Multiview Images," IEEE/OSA Journal of Display Technology, Sep. 2005, pp. 125-140, vol. 1, No. 1.

International Search Report and Written Opinion (ISRWO) by International Searching Authority (ISA) Korean Intellectual Property Office (KIPO) dated Mar. 16, 2020 (13 pages) for foreign counterpart parent International Application No. PCT/US2019/061882.

* cited by examiner

MODE-SWITCHABLE BACKLIGHT, PRIVACY DISPLAY, AND METHOD EMPLOYING EMITTER ARRAYS

CROSS-REFERENCE TO RELATED APPLICATIONS

This application is a continuation application of and claims the benefit of priority to International Patent Application No. PCT/US2019/061882, filed Nov. 15, 2019, which claims priority to U.S. Provisional Application Ser. No. 62/818,639, filed on Mar. 14, 2019, the contents of both of which are herein incorporated by reference.

STATEMENT REGARDING FEDERALLY SPONSORED RESEARCH OR DEVELOPMENT

N/A

BACKGROUND

Electronic displays are a nearly ubiquitous medium for communicating information to users of a wide variety of devices and products. Most commonly employed electronic displays include the cathode ray tube (CRT), plasma display panels (PDP), liquid crystal displays (LCD), electroluminescent displays (EL), organic light emitting diode (OLED) and active matrix OLEDs (AMOLED) displays, electrophoretic displays (EP) and various displays that employ electromechanical or electrofluidic light modulation (e.g., digital micromirror devices, electrowetting displays, etc.). Generally, electronic displays may be categorized as either active displays (i.e., displays that emit light) or passive displays (i.e., displays that modulate light provided by another source). Among the most obvious examples of active displays are CRTs, PDPs and OLEDs/AMOLEDs. Displays that are typically classified as passive when considering emitted light are LCDs and EP displays. Passive displays, while often exhibiting attractive performance characteristics including, but not limited to, inherently low power consumption, may find somewhat limited use in many practical applications given the lack of an ability to emit light.

To overcome the limitations of passive displays associated with emitted light, many passive displays are coupled to an external light source. The coupled light source may allow these otherwise passive displays to emit light and function substantially as an active display. Examples of such coupled light sources are backlights. A backlight may serve as a source of light (often a panel backlight) that is placed behind an otherwise passive display to illuminate the passive display. For example, a backlight may be coupled to an LCD or an EP display. The backlight emits light that passes through the LCD or the EP display. The light emitted is modulated by the LCD or the EP display and the modulated light is then emitted, in turn, from the LCD or the EP display. Often backlights are configured to emit white light. Color filters are then used to transform the white light into various colors used in the display. The color filters may be placed at an output of the LCD or the EP display (less common) or between the backlight and the LCD or the EP display, for example.

BRIEF DESCRIPTION OF THE DRAWINGS

Various features of examples and embodiments in accordance with the principles described herein may be more readily understood with reference to the following detailed description taken in conjunction with the accompanying drawings, where like reference numerals designate like structural elements, and in which.

Figure 1A:
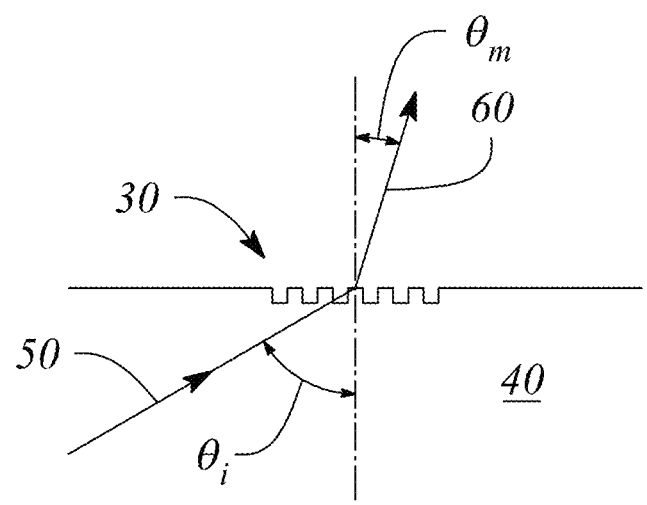
FIG. 1A illustrates a cross-sectional view of a diffraction grating in an example, according to an embodiment consistent with the principles described herein.

Certain examples and embodiments have other features that are one of in addition to and in lieu of the features illustrated in the above-referenced figures. These and other features are detailed below with reference to the above-referenced figures.

DETAILED DESCRIPTION

Examples and embodiments in accordance with the principles described herein provide mode-switchable backlighting with application to a mode-switchable privacy display. In particular, embodiments consistent with the principles described herein provide a mode-switchable backlight configured to emit narrow-angle emitted light in a first mode and broad-angle emitted light during a second mode. In some embodiments, the narrow-angle emitted light is configured to provide illumination exclusively to a first view zone during the first mode, while the broad-angle emitted light may be configured to provide illumination to a second view zone that includes the first view zone during the second mode. According to various embodiments, the narrow-angle emitted light may be provided by narrow-angle emitters during both the first mode and the second mode. Further, the broad-angle emitted light provided in the second mode represents a combination of the narrow-angle emitted light and bidirectional emitted light having a bifurcated angular extent that is complementary to an angular range of the narrow-angle emitted light. The bidirectional emitted light is provided by bidirectional emitters during the second mode, according to various embodiments.

A mode-switchable privacy display that employs the mode-switchable backlighting may be configured to provide a private displayed image during the first or 'privacy' mode, the private image being visible in the first or 'private' view zone. Further, the mode-switchable privacy display may be configured to provide a public display image during the second or 'public' mode using the broad-angle emitted light. The public displayed image may be visible in the second or 'public' view zone that includes both the private view zone and public view zone, according to various embodiments. Uses of mode-switchable backlighting and a mode-switchable privacy display described herein include, but are not limited to, mobile telephones (e.g., smart phones), watches, tablet computes, mobile computers (e.g., laptop computers), personal computers and computer monitors, automobile display consoles, cameras displays, and various other mobile as well as substantially non-mobile display applications and devices.

Herein, a 'light guide' is defined as a structure that guides light within the structure using total internal reflection. In particular, the light guide may include a core that is substantially transparent at an operational wavelength of the light guide. In various examples, the term 'light guide' generally refers to a dielectric optical waveguide that employs total internal reflection to guide light at an interface between a dielectric material of the light guide and a material or medium that surrounds that light guide. By definition, a condition for total internal reflection is that a refractive index of the light guide is greater than a refractive index of a surrounding medium adjacent to a surface of the light guide material. In some embodiments, the light guide may include a coating in addition to or instead of the aforementioned refractive index difference to further facilitate the total internal reflection. The coating may be a reflective coating, for example. The light guide may be any of several light guides including, but not limited to, one or both of a plate or slab guide and a strip guide.

Further herein, the term 'plate' when applied to a light guide as in a 'plate light guide' is defined as a piece-wise or differentially planar layer or sheet, which is sometimes referred to as a 'slab' guide. In particular, a plate light guide is defined as a light guide configured to guide light in two substantially orthogonal directions bounded by a top surface and a bottom surface (i.e., opposite surfaces) of the light guide. Further, by definition herein, the top and bottom surfaces are both separated from one another and may be substantially parallel to one another in at least a differential sense. That is, within any differentially small section of the plate light guide, the top and bottom surfaces are substantially parallel or co-planar.

In some embodiments, the plate light guide may be substantially flat (i.e., confined to a plane) and therefore, the plate light guide is a planar light guide. In other embodiments, the plate light guide may be curved in one or two orthogonal dimensions. For example, the plate light guide may be curved in a single dimension to form a cylindrical shaped plate light guide. However, any curvature has a radius of curvature sufficiently large to insure that total internal reflection is maintained within the plate light guide to guide light.

Herein, an 'angle-preserving scattering feature' or equivalently an 'angle-preserving scatterer' is any feature or scatterer configured to scatter light in a manner that substantially preserves in scattered light an angular spread of light incident on the feature or scatterer. In particular, by definition, an angular spread $\sigma_s$ of light scattered by an angle-preserving scattering feature is a function of an angular spread $\sigma$ of the incident light (i.e., $\sigma_s = f(\sigma)$). In some embodiments, the angular spread $\sigma_s$ of the scattered light is a linear function of the angular spread or collimation factor $\sigma$ of the incident light (e.g., $\sigma_s = a \cdot \sigma$, where a is an integer). That is, the angular spread $\sigma_s$ of light scattered by an angle-preserving scattering feature may be substantially proportional to the angular spread or collimation factor $\sigma$ of the incident light. For example, the angular spread $\sigma_s$ of the scattered light may be substantially equal to the incident light angular spread $\sigma$ (e.g., $\sigma_s \approx \sigma$). A uniform diffraction grating (i.e., a diffraction grating having a substantially uniform or constant diffractive feature spacing or grating pitch) is an example of an angle-preserving scattering feature. In contrast, a Lambertian scatterer or a Lambertian reflector as well as a general diffuser (e.g., having or approximating Lambertian scattering) are not angle-preserving scatterers, by definition herein.

Herein, a 'polarization-preserving scattering feature' or equivalently a 'polarization-preserving scatterer' is any feature or scatterer configured to scatter light in a manner that substantially preserves in scattered light a polarization or at least a degree of polarization of the light incident on the feature or scatterer. Accordingly, a 'polarization-preserving scattering feature' is any feature or scatterer where a degree of polarization of a light incident on the feature or scatterer is substantially equal to the degree of polarization of the scattered light. Further, by definition, 'polarization-preserving scattering' is scattering (e.g., of guided light) that preserves or substantially preserves a predetermined polarization of the light being scattered. The light being scattered may be polarized light provided by a polarized light source, for example.

Herein, the term 'unilateral' as in 'unilateral scattering element,' is defined as meaning 'one-sided' or 'preferentially in one direction' correspond to a first side as opposed to another direction correspond to a second side. In particular, a backlight configured to provide or emit light in a 'unilateral direction' is defined as a backlight that emits light from a first side and not from a second side opposite the first side. For example, the unilateral direction of emitted light provided by or scattered from a backlight light may correspond to light that is preferentially directed into a first (e.g., positive) half-space, but not into the corresponding second (e.g., negative) half-space. The first half-space may be above the backlight and the second half-space may be below the backlight. As such, the backlight may emit light into a region or toward a direction that is above the backlight and emit little or no light into another region or toward another direction that is below the backlight, for example. Similarly a 'unilateral' directional scatterer such as, but not limited to, a unilateral scattering element is configured to scatter light toward and out of a first surface, but not a second surface opposite the first surface, by definition herein.

Herein, a 'diffraction grating' is broadly defined as a plurality of features (i.e., diffractive features) arranged to provide diffraction of light incident on the diffraction grating. In some examples, the plurality of features may be arranged in a periodic manner or a quasi-periodic manner. In other examples, the diffraction grating may be a mixed-period diffraction grating that includes a plurality of diffraction gratings, each diffraction grating of the plurality having a different periodic arrangement of features. Further, the diffraction grating may include a plurality of features (e.g., a plurality of grooves or ridges in a material surface) arranged in a one-dimensional (1D) array. Alternatively, the diffraction grating may comprise a two-dimensional (2D) array of features or an array of features that are defined in two dimensions. The diffraction grating may be a 2D array of bumps on or holes in a material surface, for example. In some examples, the diffraction grating may be substantially periodic in a first direction or dimension and substantially aperiodic (e.g., constant, random, etc.) in another direction across or along the diffraction grating.

As such, and by definition herein, the 'diffraction grating' is a structure that provides diffraction of light incident on the diffraction grating. If the light is incident on the diffraction grating from a light guide, the provided diffraction or diffractive scattering may result in, and thus be referred to as, 'diffractive coupling' or 'diffractive scattering' in that the diffraction grating may couple or scatter light out of the light guide by diffraction. The diffraction grating also redirects or changes an angle of the light by diffraction (i.e., at a diffractive angle). In particular, as a result of diffraction, light leaving the diffraction grating generally has a different propagation direction than a propagation direction of the light incident on the diffraction grating (i.e., incident light). The change in the propagation direction of the light by diffraction is referred to as 'diffractive redirection' herein. Hence, the diffraction grating may be understood to be a structure including diffractive features that diffractively redirects light incident on the diffraction grating and, if the light is incident from a light guide, the diffraction grating may also diffractively couple out the light from the light guide.

Further, by definition herein, the features of a diffraction grating are referred to as 'diffractive features' and may be one or more of at, in and on a material surface (i.e., a boundary between two materials). The surface may be a surface of a light guide, for example. The diffractive features may include any of a variety of structures that diffract light including, but not limited to, one or more of grooves, ridges, holes and bumps at, in or on the surface. For example, the diffraction grating may include a plurality of substantially parallel grooves in the material surface. In another example, the diffraction grating may include a plurality of parallel ridges rising out of the material surface. The diffractive features (e.g., grooves, ridges, holes, bumps, etc.) may have any of a variety of cross sectional shapes or profiles that provide diffraction including, but not limited to, one or more of a sinusoidal profile, a rectangular profile (e.g., a binary diffraction grating), a triangular profile and a saw tooth profile (e.g., a blazed grating).

According to various examples described herein, a diffraction grating (e.g., a diffraction grating of a scattering element, as described below) may be employed to diffractively scatter or couple light out of a light guide (e.g., a plate light guide) as a light beam. In particular, a diffraction angle an of or provided by a locally periodic diffraction grating may be given by equation (1) as:

$$\theta_m = \sin^{-1}\left(n \sin \theta_i - \frac{m\lambda}{D}\right) \quad (1)$$

where λ is a wavelength of the light, m is a diffraction order, n is an index of refraction of a light guide, d is a distance or spacing between features of the diffraction grating, $\theta_i$ is an angle of incidence of light on the diffraction grating. For simplicity, equation (1) assumes that the diffraction grating is adjacent to a surface of the light guide and a refractive index of a material outside of the light guide is equal to one (i.e., $n_{out}=1$). In general, the diffraction order m is given by an integer (i.e., m=±1, ±2, ... ). A diffraction angle $\theta_m$ of a light beam produced by the diffraction grating may be given by equation (1). First-order diffraction or more specifically a first-order diffraction angle $\theta_m$ is provided when the diffraction order m is equal to one (i.e., m=1).

FIG. 1A illustrates a cross sectional view of a diffraction grating 30 in an example, according to an embodiment consistent with the principles described herein. For example, the diffraction grating 30 may be located on a surface of a light guide 40. In addition, FIG. 1A illustrates a light beam 50 incident on the diffraction grating 30 at an incident angle $\theta_i$. The incident light beam 50 may be a beam of guided light (i.e., a guided light beam) within the light guide 40. Also illustrated in FIG. 1A is a directional light beam 60 diffractively produced and coupled-out by the diffraction grating 30 as a result of diffraction of the incident light beam 50. The directional light beam 60 has a diffraction angle $\theta_m$ (or 'principal angular direction' herein) as given by equation (1). The diffraction angle $\theta_m$ may correspond to a diffraction order 'm' of the diffraction grating 30, for example diffraction order m=1 (i.e., a first diffraction order).

Herein by definition, a 'slanted' diffraction grating is a diffraction grating with diffractive features having a slant angle relative to a surface normal of a surface of the diffraction grating. According to various embodiments, a slanted diffraction grating may provide unilateral scattering by diffraction of incident light.

Figure 1B:
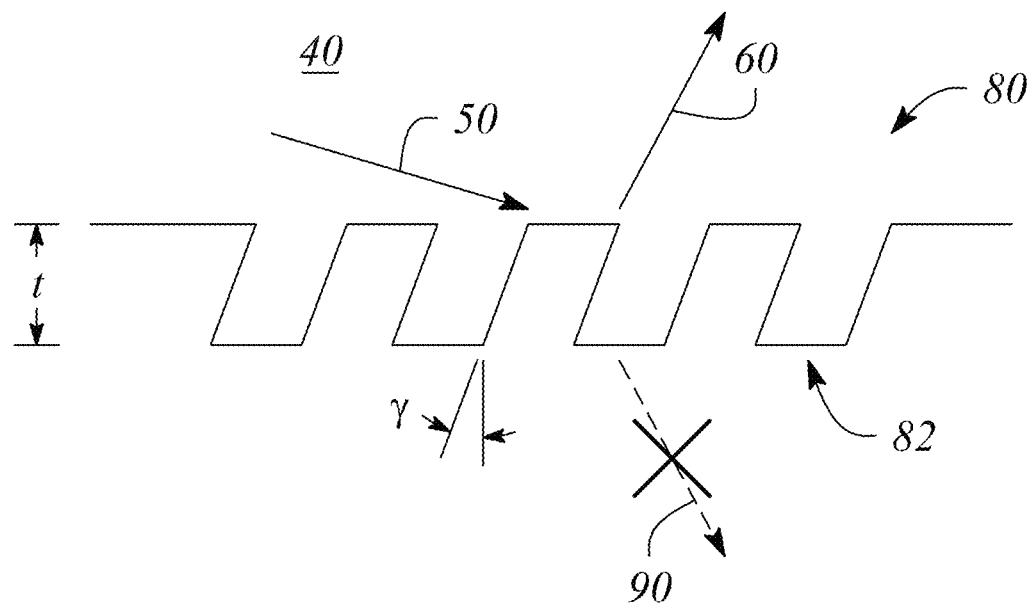
FIG. 1B illustrates a cross-sectional view of a slanted diffraction grating in an example, according to an embodiment consistent with the principles described herein.

FIG. 1B illustrates a cross-sectional view of a slanted diffraction grating 80 in an example, according to an embodiment consistent with the principles described herein. As illustrated, the slanted diffraction grating 80 is a binary diffraction grating located at a surface of a light guide 40, analogous to the diffraction grating 30 illustrated in FIG. 1A. However, the slanted diffraction grating 80 illustrated in FIG. 1B comprises diffractive features 82 having a slant angle relative to a surface normal (illustrated by a dashed line) along with a grating height, depth or thickness t, as illustrated. Also illustrated are the incident light beam 50 and a directional light beam 60 representing unilateral diffractive scattering of the incident light beam 50 by the slanted diffraction grating 80. Note that diffractive scattering of light in a secondary direction by the slanted diffraction grating 80 is suppressed by the unilateral diffractive scattering, according to various embodiments. In FIG. 1B, a 'crossed out' dashed-line arrow 90 represents suppressed diffractive scattering in the secondary direction by the slanted diffraction grating 80.

According to various embodiments, the slant angle γ of the diffractive features 82 may be selected to control a unilateral diffraction characteristic of the slanted diffraction grating 80 including a degree to which diffractive scattering in the secondary direction is suppressed. For example, the slant angle γ may be selected to be between about twenty degrees (20°) and about sixty degrees (60°) or between about thirty degrees (30°) and about fifty degrees (50°) or between about forty degrees (40°) and about fifty-five degrees (55°). A slant angle γ in a range of about 30°-60° may provide better than about forty times (40×) suppression of the diffractive scattering in secondary direction, when compared to a unilateral direction provided by the slanted diffraction grating 80, for example. According to some embodiments, the thickness t of the diffractive features 82 may be between about one hundred nanometers (100 nm)

and about four hundred nanometers (400 nm). For example, the thickness t may be between about one hundred fifty nanometers (150 nm) and about three hundred nanometers (300 nm) for grating periodicities p in a range from about 300 nm and about five hundred nanometers (500 nm).

Further, the diffractive features may be curved and may also have a predetermined orientation (e.g., a rotation) relative to a propagation direction of light, according to some embodiments. One or both of the curve of the diffractive features and the orientation of the diffractive features may be configured to control a direction of light coupled-out by the diffraction grating, for example. For example, a principal angular direction of the coupled-out light may be a function of an angle of the diffractive feature at a point at which the light is incident on the diffraction grating relative to a propagation direction of the incident light.

Herein, a 'microprism structure' is generally defined as a structure comprising a microprism or a plurality of microprisms having an inclined sidewall(s) and configured to refractively scatter light incident on the microprism structure. If the light is incident on the microprism structure from a light guide, the microprism structure may be understood as a structure comprising a microprism or a plurality of microprisms configured to refractively couple out or scatter out light from the light guide. In some embodiments, the microprism structure may comprise an inverted microprism element. By definition herein, an 'inverted microprism element' is a microprism having a truncated conical shape with an input aperture, an inclined sidewall, and an output aperture that is larger than the input aperture. In particular, the input aperture is configured to receive light and the inclined sidewall is configured to reflect the light received through the input aperture, whereas the output aperture is configured to emit the reflected light. Thus, the input aperture is a portion of the inverted microprism element comprising an optical connection between the inverted microprism element and the light guide, and configured to receive extracted or coupled-out light from the light guide. The inclined sidewall comprises an interior surface of the inverted microprism element that is configured to reflect light. In some embodiments, the inclined sidewall may comprise a reflective layer or reflective material (e.g., a reflective material layer on an exterior surface of the sidewall). The reflective layer may be configured to provide or enhance reflection at the interior surface of the inverted microprism element. The reflected light is emitted from the output aperture of the inverted microprism element.

Herein a 'collimator' is defined as substantially any optical device or apparatus that is configured to collimate light. For example, a collimator may include, but is not limited to, a collimating mirror or reflector, a collimating lens, a diffraction grating, a tapered light guide, and various combinations thereof. According to various embodiments, an amount of collimation provided by the collimator may vary in a predetermined degree or amount from one embodiment to another. Further, the collimator may be configured to provide collimation in one or both of two orthogonal directions (e.g., a vertical direction and a horizontal direction). That is, the collimator may include a shape or similar collimating characteristic in one or both of two orthogonal directions that provides light collimation, according to some embodiments.

Herein, a 'collimation factor,' denoted a, is defined as a degree to which light is collimated. In particular, a collimation factor defines an angular spread of light rays within a collimated beam of light, by definition herein. For example, a collimation factor $\sigma$ may specify that a majority of light rays in a beam of collimated light is within a particular angular spread (e.g., $+/-\sigma$ degrees about a central or principal angular direction of the collimated light beam). The light rays of the collimated light beam may have a Gaussian distribution in terms of angle and the angular spread may be an angle determined at one-half of a peak intensity of the collimated light beam, according to some examples.

Herein, a 'light source' is defined as a source of light (e.g., an optical emitter configured to produce and emit light). For example, the light source may comprise an optical emitter such as a light emitting diode (LED) that emits light when activated or turned on. In particular, herein, the light source may be substantially any source of light or comprise substantially any optical emitter including, but not limited to, one or more of a light emitting diode (LED), a laser, an organic light emitting diode (OLED), a polymer light emitting diode, a plasma-based optical emitter, a fluorescent lamp, an incandescent lamp, and virtually any other source of light. The light produced by the light source may have a color (i.e., may include a particular wavelength of light), or may be a range of wavelengths (e.g., white light). In some embodiments, the light source may comprise a plurality of optical emitters. For example, the light source may include a set or group of optical emitters in which at least one of the optical emitters produces light having a color, or equivalently a wavelength, that differs from a color or wavelength of light produced by at least one other optical emitter of the set or group. The different colors may include primary colors (e.g., red, green, blue) for example.

Herein, an 'active optical emitter' is defined as an active source of light (e.g., an optical emitter configured to produce and emit light when activated). As such, an active optical emitter does not receive light from another source of light, by definition. Instead, the active optical emitter directly generates light when activated. The active optical emitter may be activated by applying a power source such as a voltage or a current, by definition herein. For example, the active optical emitter may comprise an optical emitter such as a light emitting diode (LED) that emits light when activated or turned on. Applying a voltage to terminals of the LED, for example, may activate the LED. In particular, herein the light source may be substantially any active source of light or comprise substantially any active optical emitter including, but not limited to, one or more of a light emitting diode (LED), a laser, an organic light emitting diode (OLED), a polymer light emitting diode, a plasma-based optical emitter, and a micro LED (μLED). The light produced by the active optical emitter may have a color (i.e., may include a particular wavelength of light), or may be a plurality or range of wavelengths (e.g., polychromatic light or white light). Different colors of light provided or produced by an active optical emitter may include, but are not limited to, primary colors (e.g., red, green, blue), for example. By definition herein, a 'color emitter' is an active optical emitter that provides light having a color. In some embodiments, the active optical emitter may comprise a plurality of active optical emitters. For example, the active optical emitter may include a set or group of active optical emitters. In some embodiments, at least one of the active optical emitters in the set or group of active optical emitters may generate light having a color, or equivalently a wavelength, that differs from a color or wavelength of light produced by at least one other optical emitter of the plurality.

Herein, a 'view zone' is defined as a region or an angular range in which a displayed image may be viewed. In particular, the displayed image may be visible within the view zone, but not visible outside of the view zone, by definition herein. Herein, a 'private display image' or a displayed image provided by a 'privacy display' is defined as an image having a restricted or limited view zone (i.e., a private view zone). In general, the private displayed image may be viewable in a limited or private view zone in front of the display and is intended for viewing only by a person(s) located within the limited or private view zone. In some embodiments, a limited or private view zone of a private displayed image or equivalently of a privacy display may be less than about forty-five degrees on either side of a normal direction of (or a direction perpendicular to) a display (i.e., view zone <±45°). In other embodiments, the limited or private view zone of a private displayed image or of a privacy display may be less than plus or minus thirty degrees (i.e., view zone <±30°) or less than less than plus or minus twenty degrees (i.e., view zone <±20°).

In contrast, a public displayed image or a displayed image provided by a public display has a broad-angle viewing zone and is intended for essentially unrestricted viewing. By definition herein, a 'public displayed image' or a displayed image provided by a 'public display' is an image having a view zone that is greater than the limited or private view zone of the private displayed image. In particular, a public displayed image may have a view zone (i.e., public view zone) that is greater than about forty-five degrees on either side of the normal direction of a display (i.e., view zone>±45°). For example, the public view zone of a public displayed image or equivalently of a public display may greater than plus or minus sixty degrees (i.e., view zone>±60°). In some embodiments, the public view zone may defined by a viewing angle of an LCD computer monitor, an LCD tablet, an LCD television, or a similar digital display device meant for broad-angle viewing (e.g., about ±45-65° or more).

By definition herein, the term 'narrow-angle' as used in 'narrow-angle emitted light' is light having an angular range or extent (e.g., cone angle) that is consistent with providing illumination of a private view zone or a private image that is displayed or otherwise made available within the private view zone. As such, narrow-angle emitted light may have an angular range of less than about ±45°, or less than about ±30°, or less than about ±20°, by definition herein. Further, by definition, 'broad-angle emitted light' or more generally 'broad-angle' is used to refer to light having angular range or extent that is generally greater than an angular range or extent of the narrow-angle emitted light. Alternatively, 'broad-angle' refers to an angular range or extend consistent with a view zone of a public displayed image or a display configured to display a public displayed image. As such, in some embodiments, the broad-angle emitted light may have an angular range that is greater than plus and minus forty-five degrees (e.g., >±45°) relative to the normal direction of a display. In other embodiments, the broad-angle emitted light angular range may be greater than plus and minus fifty degrees (e.g., >±50°), or greater than plus and minus sixty degrees (e.g., >±60°), or greater than plus and minus sixty-five degrees (e.g., >±65°). For example, the angular range of the broad-angle emitted light may be greater than about seventy degrees on either side of the normal direction of the display (e.g., >±70°).

Further, as used herein, the article 'a' is intended to have its ordinary meaning in the patent arts, namely 'one or more'. For example, 'an element' means one or more elements and as such, 'the element' means 'the element(s)' herein. Also, any reference herein to 'top', 'bottom', 'upper', 'lower', 'up', 'down', 'front', back', 'first', 'second', 'left' or 'right' is not intended to be a limitation herein.

Herein, the term 'about' when applied to a value generally means within the tolerance range of the equipment used to produce the value, or may mean plus or minus 10%, or plus or minus 5%, or plus or minus 1%, unless otherwise expressly specified. Further, the term 'substantially' as used herein means a majority, or almost all, or all, or an amount within a range of about 51% to about 100%. Moreover, examples herein are intended to be illustrative only and are presented for discussion purposes and not by way of limitation.

Figure 2A:
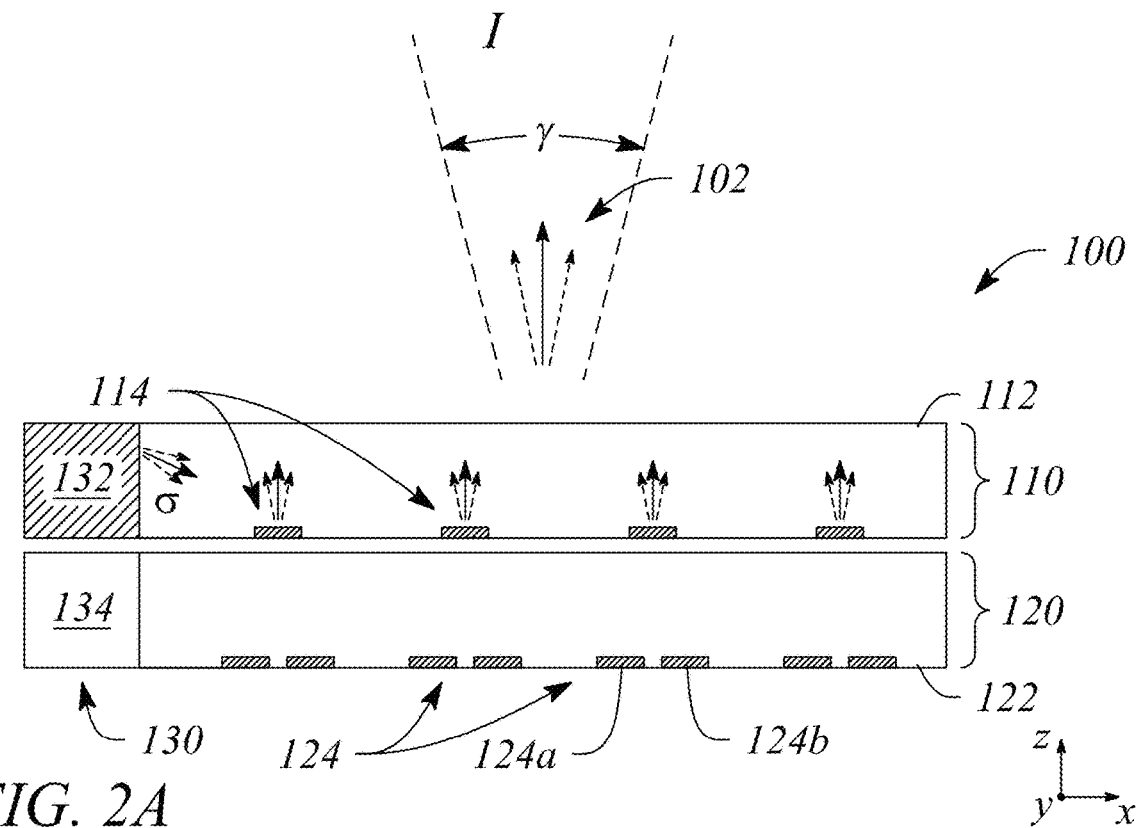
FIG. 2A illustrates a cross-sectional view of a mode-switchable backlight in an example, according to an embodiment consistent with the principles described herein.
Figure 2B:
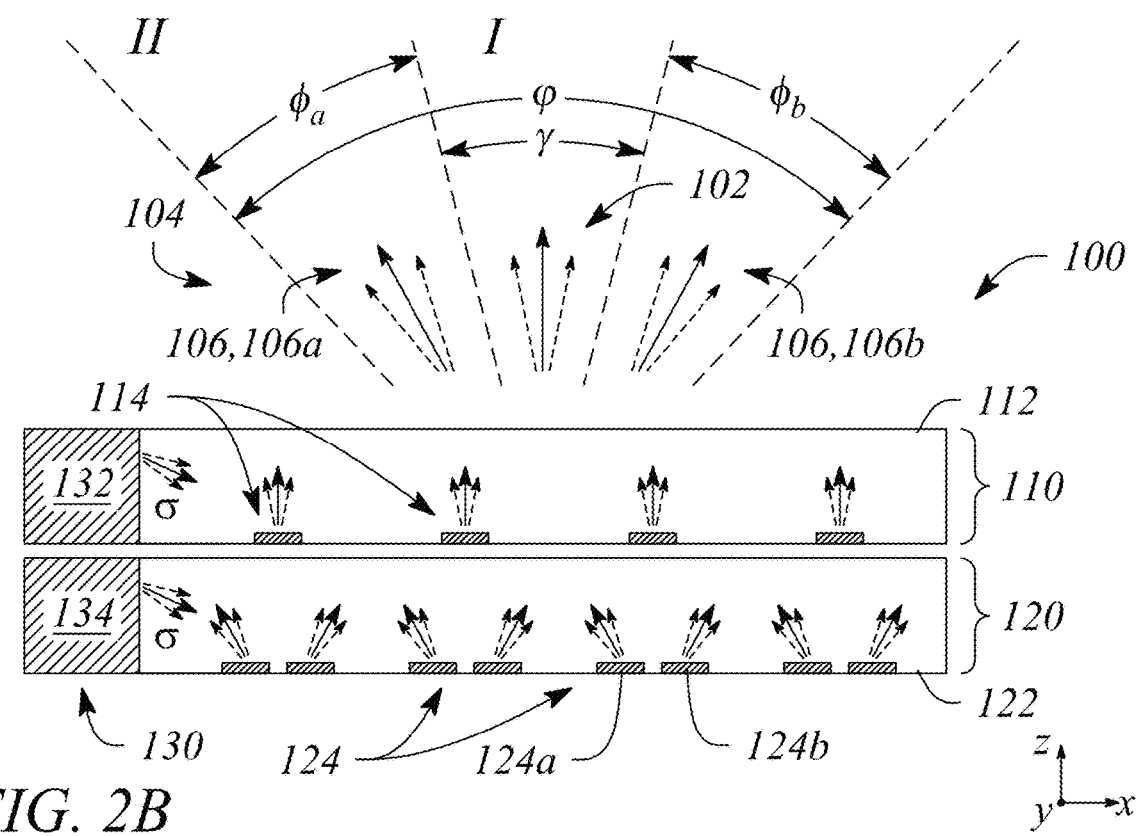
FIG. 2B illustrates a cross-sectional view of a mode-switchable backlight in another example, according to an embodiment consistent with the principles described herein.

According to some embodiments of the principles described herein, a mode-switchable backlight is provided. FIG. 2A illustrates a cross-sectional view of a mode-switchable backlight 100 in an example, according to an embodiment consistent with the principles described herein. FIG. 2B illustrates a cross-sectional view of a mode-switchable backlight 100 in another example, according to an embodiment consistent with the principles described herein. As illustrated, the mode-switchable backlight 100 is configured to provide or emit light as narrow-angle emitted light 102 in or during a first mode (e.g., a privacy mode) and broad-angle emitted light 104 in a second mode (e.g., a public mode). In particular, FIG. 2A illustrates the mode-switchable backlight 100 in the first mode with narrow-angle emitted light 102, while FIG. 2B illustrates the mode-switchable backlight 100 in the second mode providing broad-angle emitted light 104. Further, a direction of the narrow-angle and broad-angle emitted light 102, 104 corresponds to a half-space above a surface of the mode-switchable backlight 100, in FIGS. 2A-2B.

The mode-switchable backlight 100 illustrated in FIGS. 2A and 2B comprises a first directional backlight 110. The first directional backlight 110 comprises an array of narrow-angle emitters 114 configured to emit or provide the narrow-angle emitted light 102 during both the first mode and the second mode of the mode-switchable backlight 100. According to various embodiments, the narrow-angle emitted light 102 provided by narrow-angle emitters 114 of the narrow-angle emitter array has as angular range rand may be directed into a first view zone/by the first directional backlight 110 during both the first and second modes. Moreover, the angular range γ of the narrow-angle emitted light 102 is configured to confine or substantially confine the narrow-angle emitted light 102 to the first view zone I during both modes. As such, the narrow-angle emitted light 102 may be exclusively visible within the first view zone I, according to various embodiments. In FIGS. 2A-2B, the narrow-angle emitted light 102 provided by the narrow-angle emitters 114 is illustrated as a plurality of arrows within the angular range γ delineated by dashed lines that correspond to the first view zone I.

As illustrated in FIGS. 2A and 2B, the mode-switchable backlight 100 further comprises a second directional backlight 120. The second directional backlight 120 comprises an array of bidirectional emitters 124 configured to emit or provide bidirectional emitted light 106 exclusively during the second mode, e.g., as illustrated in FIG. 2B. According to various embodiments, the bidirectional emitted light 106 provided by bidirectional emitters 124 of the bidirectional emitter array has a bifurcated angular extent. Further, the bifurcated angular extent is complementary to an angular range of the narrow-angle emitted light 102. In various embodiments, a combination of the narrow-angle emitted light 102 and the bidirectional emitted light 106 during the second mode is configured to provide the broad-angle emitted light 104 having an angular range φ that is a summation of an angular range of the narrow-angle emitted light 102 and the bifurcated angular extent of the bidirectional emitted light 106.

In particular, as illustrated in FIG. 2B, the bidirectional emitted light 106 provided by the bidirectional emitters 124 has a first segment 106a directed in a first direction and a second segment 106b directed in a second direction. The bifurcated angular extent of the bidirectional emitted light 106 is a combination of an angular range $\phi_a$ of the first segment 106a around or centered on the first direction and an angular range $\phi_b$ of the second segment 106b around or centered on the second direction. Further, the bidirectional emitted light 106 provided by the second directional backlight 120 is substantially excluded from the angular range $\gamma$ of the narrow-angle emitted light 102, according to various embodiments. In the second mode, both the narrow-angle emitted light 102 is provided by the first directional backlight 110 and the bidirectional emitted light 106 is provided by the second directional backlight 120. As such, the broad-angle emitted light 104 is provided by the combination of the narrow-angle emitted light 102 and the bidirectional emitted light 106, as illustrated in FIG. 2B.

By definition herein, the bidirectional emitted light 106 has a bifurcated angular extent (i.e., $\phi_a+\phi_b$) that is 'complementary' to the angular range $\gamma$ of the narrow-angle emitted light 102. That is, when the bidirectional emitted light 106 and the narrow-angle emitted light 102 are combined during the second mode, the resulting broad-angle emitted light 104 has the angular range $\varphi$, which is a sum of the angular range $\gamma$ of the narrow-angle emitted light 102 and the angular extent of the bidirectional emitted light 106, i.e., $\varphi=\gamma+(\phi_a+\phi_b)$. Put another way, the bidirectional emitted light 106 provides or essentially 'fills in' a portion of the broad-angle emitted light 104 that is not provided by the narrow-angle emitted light 102. Thus, the angular extent ($\phi_a+\phi_b$) of the bidirectional emitted light 106 is complementary to the angular range $\gamma$ of the narrow-angle emitted light 102, as illustrated in FIG. 2B.

Figure 3:
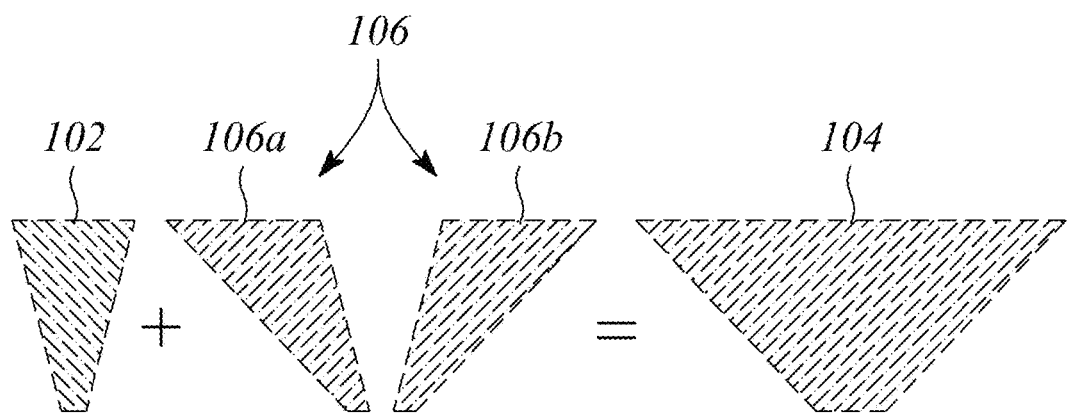
FIG. 3 illustrates a graphical representation of a combination of narrow-angle emitted light and bidirectional emitted light to provide broad-angle emitted light in an example, according to an embodiment consistent with the principles described herein.

FIG. 3 illustrates a graphical representation of a combination of narrow-angle emitted light 102 and bidirectional emitted light 106 to provide broad-angle emitted light 104 in an example, according to an embodiment consistent with the principles described herein. As illustrated, the narrow-angle emitted light 102 is added to the bidirectional emitted light 106 to create the broad-angle emitted light 104. Summation of the narrow-angle emitted light 102 and the bidirectional emitted light 106 is graphically represented by a plus sign '+' and an equals sign '=' in FIG. 3. Note that the first segment 106a and second segment 106b of the bidirectional emitted light 106 represent regions in which the bidirectional emitted light 106 is present, while no light is present between the first and second segments 106a, 106b before the summation, as illustrated. Further, the bifurcated angular extent of the bidirectional emitted light 106 is complementary to the angular range of the narrow-angle emitted light 102, since an angular range between the first and second segments 106a, 106b is equal to the angular range of the narrow-angle emitted light 102, as illustrated.

In some embodiments, the narrow-angle emitted light 102 is configured to provide illumination exclusively the first view zone I during the first mode. Further, the broad-angle emitted light 104 may be configured to provide illumination to the second view zone II that includes the first view zone I during the second mode, in some embodiments. Referring again to FIGS. 2A-2B, the mode-switchable backlight 100 may appear as illuminated to a viewer in the first view zone I during both of the first and second modes. Similarly, another viewer in the second view zone II outside of the first view zone I may perceive the mode-switchable backlight 100 as being illuminated during the second mode. However, the mode-switchable backlight 100 may appear to the other viewer in the second view zone II as being dark or not illuminated during the first mode, according to various embodiments. Thus, the first mode may be referred to as a privacy mode and the first view zone I may be a privacy view zone, since the illumination is provided only to the viewer in the first (privacy) view zone I during the first (privacy) mode, for example. On the other hand, since during the second mode both viewers may perceive the illumination, the second mode may be referred to as a public mode and the second view zone II (that includes the first view zone I) may be a public view zone, for example.

Figure 6A:
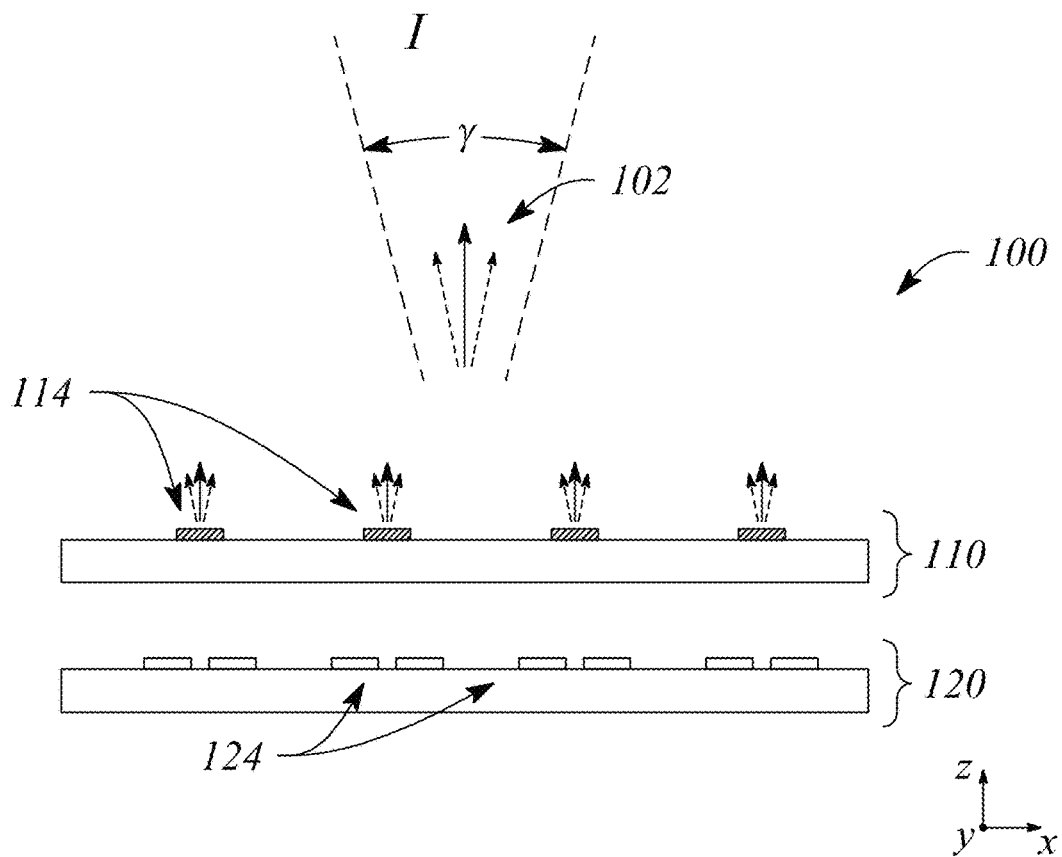
FIG. 6A illustrates a cross-sectional view of a mode-switchable backlight in an example, according to an embodiment consistent with the principles described herein.
Figure 6B:
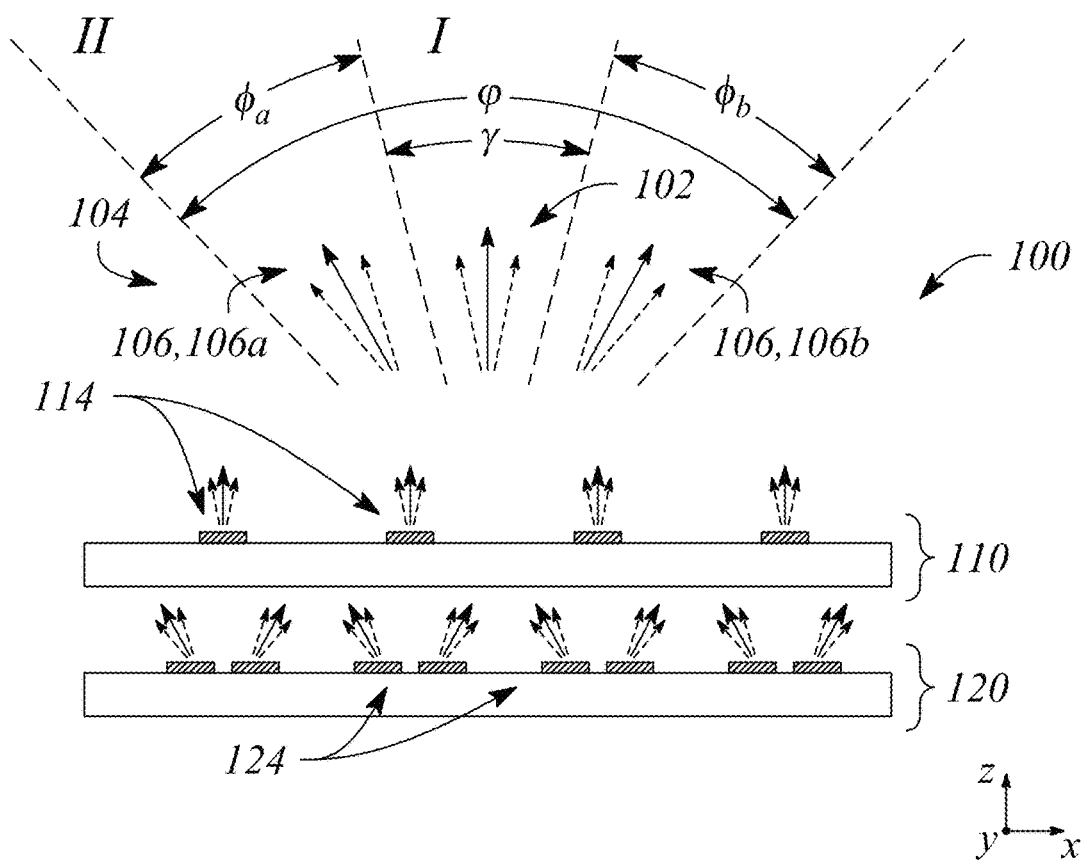
FIG. 6B illustrates a cross-sectional view of a mode-switchable backlight in another example, according to an embodiment consistent with the principles described herein.

In some embodiments (e.g., as illustrated in FIGS. 2A-2B), one or both of the narrow-angle emitters 114 and the bidirectional emitters 124 comprise passive emitters. In particular, as passive emitters the narrow-angle emitters 114 and bidirectional emitters 124 do not generate light themselves, but instead redirect light from another source to the provide emitted light representing the narrow-angle emitted light 102 and bidirectional emitted light 106, respectively. In other embodiments (e.g., as illustrated in FIGS. 6A-6B, described below), one or both of the narrow-angle emitters 114 of the narrow-angle emitter array and the bidirectional emitters 124 of the bidirectional emitter array comprise active optical emitters. As active optical emitters, the narrow-angle emitters 114 and bidirectional emitters 124 generate the emitted light representing the narrow-angle emitted light 102 and bidirectional emitted light 106, respectively.

As illustrated in FIGS. 2A-2B, the first directional backlight 110 of the mode-switchable backlight 100 comprises a light guide 112. Similarly, the second directional backlight 120 of the mode-switchable backlight 100 comprises a light guide 122, as illustrated in FIGS. 2A-2B. The light guide 112, 122 may be a plate light guide, according to some embodiments. The light guide 112, 122 is configured to guide light along a length of the light guide 112, 122 as guided light. For example, the light guide 112, 122 may include a dielectric material configured as an optical waveguide. The dielectric material may have a first refractive index that is greater than a second refractive index of a medium surrounding the dielectric optical waveguide. The difference in refractive indices is configured to facilitate total internal reflection of the guided light according to one or more guided modes of the light guide 112, 122, for example.

In particular, the light guide 112, 122 may be a slab or plate optical waveguide comprising an extended, substantially planar sheet of optically transparent, dielectric material. The substantially planar sheet of dielectric material is configured to guide the guided light using total internal reflection. According to various examples, the optically transparent material of the light guide 112, 122 may include or be made up of any of a variety of dielectric materials including, but not limited to, one or more of various types of glass (e.g., silica glass, alkali-aluminosilicate glass, borosilicate glass, etc.) and substantially optically transparent plastics or polymers (e.g., poly(methyl methacrylate) or 'acrylic glass', polycarbonate, etc.). In some examples, the light guide 112, 122 may further include a cladding layer (not illustrated) on at least a portion of a surface (e.g., one or both of the top surface and the bottom surface) of the light guide 112, 122. The cladding layer may be used to further facilitate total internal reflection, according to some examples.

Further, according to some embodiments, the light guide 112, 122 is configured to guide the guided light according to total internal reflection at a non-zero propagation angle between a first surface (e.g., 'front' surface or side) and a second surface (e.g., 'back' surface or side) of the light guide 112, 122. In particular, the guided light propagates by reflecting or 'bouncing' between the first surface and the second surface of the light guide 112, 122 at the non-zero propagation angle. In some embodiments, the guided light comprises a plurality of guided light beams of different colors of light. The light beams of the plurality of guided light beams may be guided by the light guide 112, 122 at respective ones of different color-specific, non-zero propagation angles. Note that the non-zero propagation angle is not illustrated for simplicity of illustration.

As defined herein, a 'non-zero propagation angle' is an angle relative to a surface (e.g., the first surface or the second surface) of the light guide 112, 122. Further, the non-zero propagation angle is both greater than zero and less than a critical angle of total internal reflection within the light guide 112, 122, according to various embodiments. For example, the non-zero propagation angle of the guided light may be between about ten degrees (10°) and about fifty degrees (50°) or, in some examples, between about twenty degrees (20°) and about forty degrees (40°), or between about twenty-five degrees (25°) and about thirty-five degrees (35°). For example, the non-zero propagation angle may be about thirty degrees (30°). In other examples, the non-zero propagation angle may be about 20°, or about 25°, or about 35°. Moreover, a specific non-zero propagation angle may be chosen (e.g., arbitrarily) for a particular implementation as long as the specific non-zero propagation angle is chosen to be less than the critical angle of total internal reflection within the light guide 112, 122.

The guided light in the light guide 112, 122 may be introduced or coupled into the light guide 112, 122 at the non-zero propagation angle (e.g., about 30°-35°). For example, the guided light may be provided by a light source of the mode-switchable backlight 100. One or more of a lens, a mirror or similar reflector (e.g., a tilted collimating reflector), a diffraction grating, and a prism (not illustrated) may facilitate coupling light into an input end of the light guide 112, 122 as the guided light at the non-zero propagation angle, for example. Once coupled into the light guide 112, 122, the guided light propagates along the light guide 112, 122 in a direction that may be generally away from the input end (e.g., illustrated by bold arrows pointing along an x-axis in FIGS. 2A-2B).

Further, the guided light may be collimated, according to various embodiments. Herein, a 'collimated light' or 'collimated light beam' is generally defined as a beam of light in which rays of the light beam are substantially parallel to one another within the light beam (e.g., the guided light). Further, rays of light that diverge or are scattered from the collimated light beam are not considered to be part of the collimated light beam, by definition herein. In some embodiments, the mode-switchable backlight 100 may include a collimator, such as, but not limited to, a lens, reflector or mirror, a diffraction grating, or a tapered light guide, configured to collimate the light, e.g., from a light source. In some embodiments, the light source comprises a collimator. The collimated light provided to the light guide 112, 122 is a collimated guided light. The guided light may be collimated according to or having a collimation factor σ, in various embodiments.

The first directional backlight 110 of the mode-switchable backlight 100 illustrated in FIGS. 2A-2B further comprises the array of narrow-angle emitters 114. In particular, the illustrated narrow-angle emitters 114 are passive optical emitters comprising unilateral scattering elements. As such, the narrow-angle emitter array comprises an array of unilateral scattering elements spaced apart from one another along the light guide length. According to various embodiments, the array of unilateral scattering elements representing the array of narrow-angle emitters 114 is configured to scatter out a portion of the guided light as the narrow-angle emitted light 102 having a unilateral direction. In particular, the narrow-angle emitters 114 as unilateral scattering elements of the narrow-angle emitter array may be separated from one another by a finite space and represent individual, distinct elements along the light guide length. That is, by definition herein, the narrow-angle emitters 114 are spaced apart from one another according to a finite (i.e., non-zero) inter-element distance (e.g., a finite center-to-center distance). Further, the narrow-angle emitters 114 of the narrow-angle emitter array or equivalently the unilateral scattering elements of the unilateral scattering element array generally do not intersect, overlap or otherwise touch one another, according to some embodiments. Thus, each unilateral scattering element of the unilateral scattering element array is generally distinct and separated from other ones of the unilateral scattering elements. Further, the unilateral direction is away from the second directional backlight 120, according to various embodiments.

According to some embodiments, the narrow-angle emitters 114 of the narrow-angle emitter array or unilateral scatter elements of the unilateral scattering element array may be arranged in either a one-dimensional (1D) array or a two-dimensional (2D) array. For example, the narrow-angle emitters 114 may be arranged as a linear 1D array. In another example, the narrow-angle emitters 114 may be arranged as a rectangular 2D array or as a circular 2D array. Further, the array (i.e., 1D or 2D array) may be a regular or uniform array, in some examples. In particular, an inter-element distance (e.g., center-to-center distance or spacing) between the narrow-angle emitters 114 may be substantially uniform or constant across the array. In other examples, the inter-element distance between the narrow-angle emitters 114 may be varied one or both of across the array and along the length of the light guide 112 of the first directional backlight 110.

According to some embodiments, a unilateral scattering element of the array of unilateral scattering elements comprises a slanted diffraction grating. In some embodiments, all of the unilateral scattering elements may be or comprise slanted diffraction gratings. The slanted diffraction grating of the unilateral scattering element is configured to provide diffractive scattering in the unilateral direction and further to suppress secondary diffractive scattering, according to various embodiment.

Figure 4A:
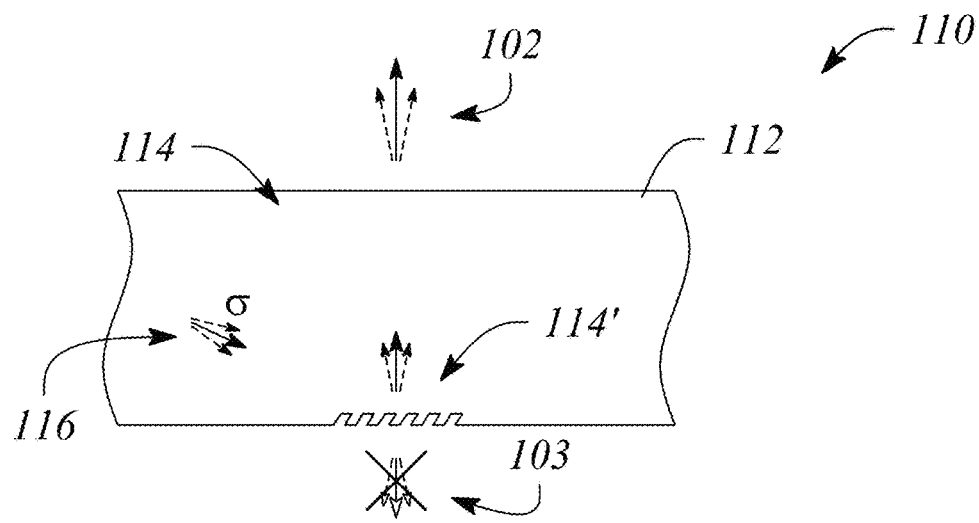
FIG. 4A illustrates a cross-sectional view of a portion of a first directional backlight of a mode-switchable backlight in an example, according to an embodiment consistent with the principles described herein.

FIG. 4A illustrates a cross-sectional view of a portion of a first directional backlight 110 of a mode-switchable backlight 100 in an example, according to an embodiment consistent with the principles described herein. In particular, FIG. 4A illustrates the first directional backlight 110 comprising the light guide 112 along with a narrow-angle emitter 114 as a unilateral scattering element. Further, as illustrated in FIG. 4A, the unilateral scattering element comprises a slanted diffraction grating 114'. Guided light 116 having a collimation factor σ, illustrated as a plurality of arrows, incident on the slanted diffraction grating 114' may be diffractively scattered out of the light guide 112 in a unilateral direction as the narrow-angle emitted light 102, as illustrated.

In some embodiments, the slanted diffraction grating 114' of the unilateral scattering element may be substantially similar to the slanted diffraction grating 80 illustrated in FIG. 1B. For example, a slant angle of the slanted diffraction grating 114', corresponding to the slant angle γ illustrated in FIG. 1B, may be between about thirty degrees (30°) and about fifty degrees (50°) relative a surface normal of the light guide 112, in some embodiments. Further, the slanted diffraction grating 114' may comprise a plurality of sub-gratings, each sub-grating being a slanted diffraction grating, in some embodiments (not illustrated). As in FIG. 1B, the slanted diffraction grating 114' of the unilateral scattering element illustrated in FIG. 4A may suppress secondary scattering in an opposite direction to the unilateral direction, e.g., illustrated by crossed-out arrows 103 in FIG. 4A.

In some embodiments, the unilateral scattering element of the array of unilateral scattering elements may comprise a reflection mode diffraction grating. The reflection mode diffraction grating is configured to selectively scatter out the guided light portion in the unilateral direction using a combination of diffractive scattering and reflection, according to various embodiments. In some embodiments, all of the unilateral scattering elements may be or comprise reflection mode diffraction gratings. In some embodiments, the reflection mode diffraction grating comprises a diffraction grating and a layer of reflective material (e.g., a metal layer), the diffraction grating being configured to provide diffractive scattering and the reflective material layer being configured to provide reflection of diffractively scattered light to insure that the diffractive scattering produces scatter out light having the unilateral direction.

Figure 4B:
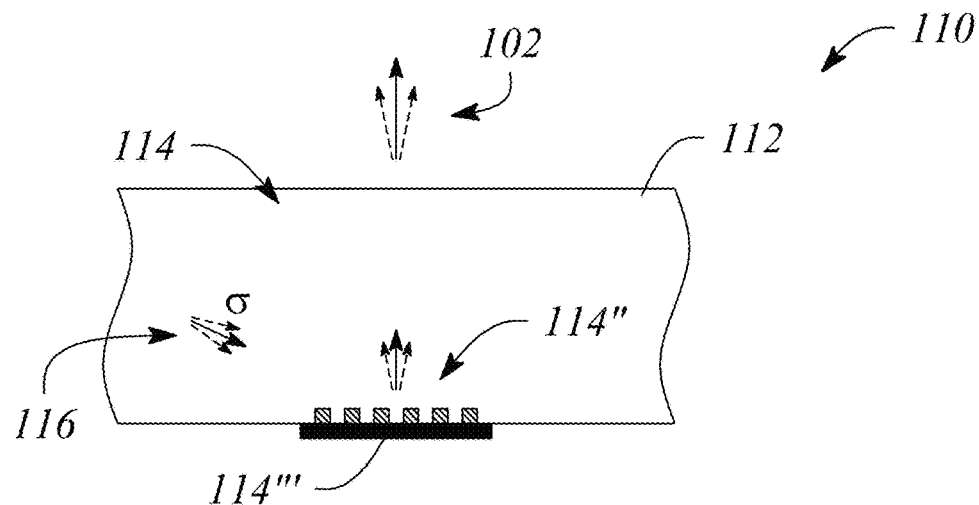
FIG. 4B illustrates a cross-sectional view of a portion of a first directional backlight of a mode-switchable backlight in an example, according to another embodiment consistent with the principles described herein.

FIG. 4B illustrates a cross-sectional view of a portion of a first directional backlight 110 of a mode-switchable backlight 100 in an example, according to another embodiment consistent with the principles described herein. In particular, FIG. 4B illustrates the first directional backlight 110 comprising the light guide 112 along with a narrow-angle emitter 114 as a unilateral scattering element. Further, as illustrated in FIG. 4B, the unilateral scattering element comprises a reflection mode diffraction grating comprising a diffraction grating 114" and a reflective material layer 114'". Guided light 116 having a collimation factor σ, illustrated as a plurality of arrows, incident on the diffraction grating 114" may be diffractively scattered out of the light guide 112 in a unilateral direction as the narrow-angle emitted light 102. Further, light that is diffractively scattered in a second direction by the diffraction grating 114" may be reflectively redirected into the unilateral direction by the reflective material layer 114'", according to various embodiments.

In other embodiments (not illustrated), the unilateral scattering element of the narrow-angle emitters 114 may comprise another type of unilateral scattering structure including, but not limited to, a micro-refractive element and a micro-reflective element. The micro-refractive element may comprise a microprism at a surface of the light guide 112 and configured to refractively couple the guided light portion out of the light guide 112 as the narrow-angle emitted light 102, for example. Examples of micro-reflective elements include, but are not limited to, faceted reflectors having a facet with surface angle configured to reflectively scatter out the guided light portion as the narrow-angle emitted light 102. In some embodiments, the narrow-angle emitter 114 as a passive optical emitter comprises an angle-preserving scatterer configured to scatter out the guided light portion having an angular range that is proportional a collimation factor c of the guided light within the light guide 112. As such, the collimation factor c of the guided light may determine the angular range γ of the narrow-angle emitted light 102, in some embodiments.

Referring again to FIGS. 2A and 2B, the second directional backlight 120 further comprises the array of the bidirectional emitters 124. In particular, the illustrated bidirectional emitters 124 are passive optical emitters comprising directional scattering feature configured to scatter out a portion or portions of the guided light within the light guide 122 as the bidirectional emitted light 106. In particular, the bidirectional emitter 124 as a directional scattering feature may comprise a first directional scattering element 124a and a second directional scattering elements 124b. The first directional scattering element 124a may be configured to scatter out a portion of the guided light as the first segment 106a of the bidirectional emitted light 106 having the first direction of the bifurcated angular extent. Further, the second directional scattering element 124b may be configured to scatter out another portion of the guided light as the second segment 106b of the bidirectional emitted light 106 having the second direction of the bifurcated angular extent. According to various embodiments, the first and second directions in combination with an angular range of the first and second segments 106a, 106b determine the bifurcated angular extent of the bidirectional emitted light 106, as described above. Moreover, together the first directional scatter element 124a and second directional scattering element 124b represent a pair of passive optical emitters of the bidirectional emitter 124.

According to various embodiments, any of a variety of directional scatterers may be employed as the directional scattering elements 124a, 124b. In particular, in some embodiments, a directional scattering element 124a, 124b of one or both of the first directional scattering element 124a and the second directional scattering element 124b may comprise a diffraction grating. A grating pitch of the diffraction grating may be used to determine a direction of light diffractively scattered out by the diffraction grating, for example. The diffraction grating may be a reflection mode diffraction grating, according to some embodiments. In other embodiments, the diffraction grating may be a transmission mode diffraction grating and the second directional backlight 120 may further comprise a reflection layer at a surface of the light guide opposite to an emission surface from which the bidirectional emitted light 106 is provided or emitted by passive optical emitters.

In other embodiments (not illustrated), the directional scattering element of the bidirectional emitter 124, or equivalently directional scattering elements 124a, 124b, may comprise another type of scattering structure including, but not limited to, a micro-refractive element and a micro-reflective element. The micro-refractive element may comprise a microprism at a surface of the light guide 122 and configured to refractively couple the guided light portion out of the light guide 122 as the bidirectional emitted light 106 or equivalently as the first and second segments 106a, 106b thereof, for example. Examples of micro-reflective elements include, but are not limited to, faceted reflectors having a facet with surface angle configured to reflectively scatter out the guided light portion as the bidirectional emitted light 106. In some embodiments, the bidirectional emitter 124 as a passive optical emitter comprises an angle-preserving scatterer configured to scatter out the guided light portion having an angular range that is proportional a collimation factor σ of the guided light within the light guide 122. As such, the collimation factor σ of the guided light may determine the angular extent (i.e., angular ranges $\phi_a$, $\phi_b$ of the first and second segments 106a, 106b) of the bidirectional emitted light 106, in some embodiments. Further, the bidirectional emitters 124 of the bidirectional emitter array may be arranged in either a 1D array or a 2D array, e.g., similar to the 1D and 2D arrays described above with respect to the narrow-angle emitters 114.

Figure 5:
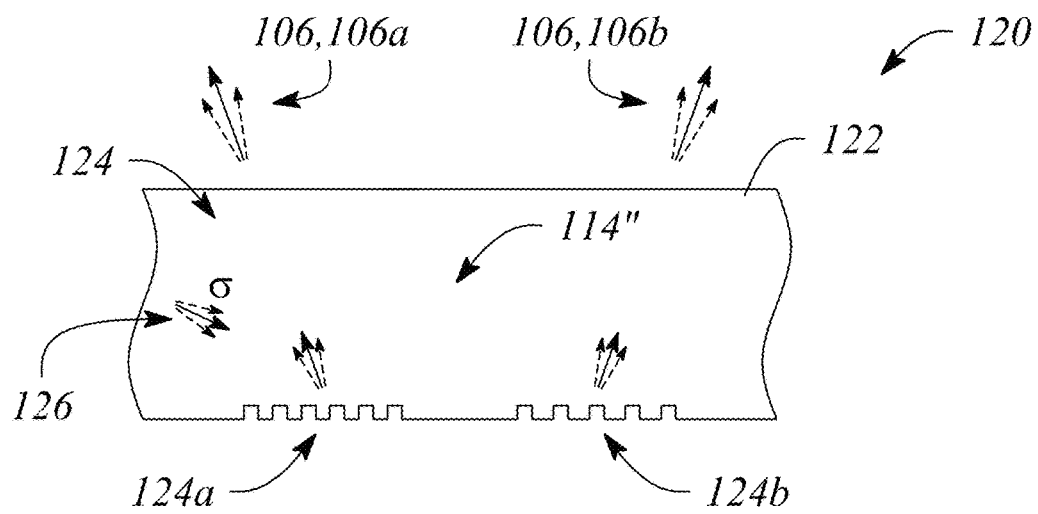
FIG. 5 illustrates a cross-sectional view of a portion of a second directional backlight in an example, according to an embodiment consistent with the principles described herein.

FIG. 5 illustrates a cross-sectional view of a portion of a second directional backlight 120 in an example, according to an embodiment consistent with the principles described herein. As illustrated, the second directional backlight 120 comprises the light guide 122 along with a bidirectional emitter 124 comprising a pair of directional scattering element 124a, 124b. Further, the directional scattering elements 124a, 124b of the pair comprise diffraction gratings, as illustrated. A grating pitch of the diffraction grating differ from one another to provide the bidirectional emitted light 106 having the first and second directions of the bifurcated angular extent. In particular, guided light 126 having a collimation factor σ, illustrated as a plurality of arrows, incident on the diffraction gratings may be diffractively scattered out of the light guide 122 in each of the first and second directions corresponding to the first segment 106a and the second segment 106b of the bidirectional emitted light 106 as a result of the differing grating pitch of the diffraction gratings. For example, a relatively smaller grating pitch or diffractive feature spacing may provide scattered out light having the first direction, while a relatively larger grating pitch or diffractive feature spacing may provide scattered out light having the second direction, as illustrated in FIG. 5.

Referring again to FIGS. 2A and 2B, the mode-switchable backlight 100 having passive optical emitters may further comprise a light source 130. In particular, the light source 130 may comprise a first light source 132 optically coupled to an input of the light guide 112 of the first directional backlight 110, the first light source 132 being configured to provide the light to the light guide 112. The light source 130 may further comprise a second light source 134 optically coupled to an input of the light guide 122 of the second directional backlight 120, the second light source 134 being configured to provide the light to the light guide 122. According to various embodiments, the guided light in the light guides 112, 122 provided respectively by the first and second light sources 132, 134 may be collimated according to a predetermined collimation factor. In various embodiments, the light source 130 may be configured to provide light to the light guide 112 of the first directional backlight 110 using the first light source 132 during the first mode. Further, the light source 130 may be configured to provide light to both the light guide 112 of the first directional backlight 110 and the light guide 122 of the second directional backlight 120 during the second mode, according to various embodiments. In FIGS. 2A-2B, cross-hatching is used to indicate whether or not the first and second light sources 132, 134 are active and providing light, e.g., in the first mode (FIG. 2A) and the second mode (FIG. 2B), respectively.

The light source 130 including the first and second light source 132, 134 may comprise substantially any source of light (e.g., optical emitter) including, but not limited to, a light emitting diode (LED), a laser (e.g., laser diode) or a combination thereof. In some embodiments, the light source 130 may comprise an optical emitter configured produce a substantially monochromatic light having a narrowband spectrum denoted by a particular color. In particular, the color of the monochromatic light may be a primary color of a particular color space or color model (e.g., a red-green-blue (RGB) color model). In other examples, the light source 130 may be a substantially broadband light source configured to provide substantially broadband or polychromatic light. For example, the light source 130 may provide white light. In some embodiments, the light source 130 may comprise a plurality of different optical emitters configured to provide different colors of light. The different optical emitters may be configured to provide light having different, color-specific, non-zero propagation angles of the guided light corresponding to each of the different colors of light.

In some embodiments, one or both of the first light source 132 and the second light source 134 of the light source 130 may further comprise a collimator. The collimator may be configured to receive substantially uncollimated light from one or more of the optical emitters of the light source 130. The collimator is further configured to convert the substantially uncollimated light into collimated light. In particular, the collimator may provide collimated light one or both of having the non-zero propagation angle and being collimated according to a predetermined collimation factor, according to some embodiments. Moreover, when optical emitters of different colors are employed, the collimator may be configured to provide the collimated light having one or both of different, color-specific, non-zero propagation angles and having different color-specific collimation factors. The collimator is further configured to communicate the collimated light beam to the light guide 112, 122 to propagate as guided light.

In some embodiments, the first directional backlight 110 of the mode-switchable backlight 100 may be configured to be substantially transparent to light in a direction through the light guide 112 orthogonal to (or substantially orthogonal) to a propagation direction of guided light within the light guide 112. In particular, the light guide 112 and the spaced apart unilateral scattering elements of the narrow-angle emitter array may allow light to pass through the light guide 112 from a first (e.g., bottom) surface to a second (e.g., top) surface thereof, in some embodiments. Transparency may be facilitated, at least in part, due to both a relatively small size of the unilateral scattering elements and a relative larger inter-element spacing of the unilateral scattering elements, in some embodiments. Further, when slanted diffraction gratings 114' are used as the unilateral scattering elements of the narrow-angle emitter array, the slanted diffraction grating 114' may also be substantially transparent to light propagating orthogonal to surfaces of the light guide 112, according to some embodiments.

In some embodiments (e.g., as illustrated in FIGS. 2A-2B), the first directional backlight 110 is configured to provide the narrow-angle emitted light 102 from a first (e.g., top) surface. Further, the second directional backlight 120 may be adjacent to a second surface of the first directional backlight 110 opposite to the first surface. The second directional backlight 120 may be configured to provide the bidirectional emitted light 106 to the second surface of the first directional backlight 110. According to these embodiments, the first directional backlight 110 may be transparent to the bidirectional emitted light 106.

In some embodiments, a diffraction grating described herein (e.g., a slanted diffraction grating or another diffraction grating) may be a uniform diffraction grating in which a diffractive feature spacing is substantially constant or unvarying throughout the diffraction grating. In other embodiments, the diffraction grating is a chirped diffraction grating. By definition, the 'chirped' diffraction grating is a diffraction grating exhibiting or having a diffraction spacing of the diffractive features (i.e., the grating pitch) that varies across an extent or length of the chirped diffraction grating.

In some embodiments, the chirped diffraction grating may have or exhibit a chirp of the diffractive feature spacing that varies linearly with distance. As such, the chirped diffraction grating is a 'linearly chirped' diffraction grating, by definition. In other embodiments, the chirped diffraction grating may exhibit a non-linear chirp of the diffractive feature spacing. Various non-linear chirps may be used including, but not limited to, an exponential chirp, a logarithmic chirp or a chirp that varies in another, substantially non-uniform or random but still monotonic manner. Non-monotonic chirps such as, but not limited to, a sinusoidal chirp or a triangle or sawtooth chirp, may also be employed. Combinations of any of these types of chirps may also be employed. Further, the slant angle of the slanted diffraction grating 114' of the unilateral scattering element may vary across, a length, a width, or an extent of the slanted diffraction grating 114'. Further, in some embodiment, diffractive features of diffraction gratings herein may be curved, e.g., curved grooves or ridges in a surface of a light guide.

As described above, in some embodiments one or both of the narrow-angle emitters 114 of the narrow-angle emitter array and the bidirectional emitters 124 of the bidirectional emitter array comprise active optical emitters. FIG. 6A illustrates a cross-sectional view of a mode-switchable backlight 100 in an example, according to an embodiment consistent with the principles described herein. FIG. 6B illustrates a cross-sectional view of a mode-switchable backlight 100 in another example, according to an embodiment consistent with the principles described herein. In particular, FIGS. 6A and 6B illustrate the mode-switchable backlight 100 with both the narrow-angle emitters 114 and the bidirectional emitters 124 comprising active optical emitters. Further, FIGS. 6A-6B illustrate the narrow-angle emitted light 102, broad-angle emitted light 104, and bidirectional emitted light 106 having characteristics substantially similar those described above with reference to FIGS. 2A-2B and 3. Further, as illustrated in FIGS. 6A and 6B, the mode-switchable backlight 100 comprises the first directional backlight 110 comprising the array of narrow-angle emitters 114 and the second directional backlight 120 comprising the array of bidirectional emitters 124.

In FIGS. 6A-6B (and also in FIGS. 2A-2B), a bidirectional emitter 124 of the bidirectional emitter array is illustrated as being aligned with a corresponding narrow-angle emitter 114 of the narrow-angle emitter array. Further, the bidirectional emitter 124 and corresponding narrow-angle emitter 114 are illustrated as cooperatively providing the broad-angle emitted light 104 during the second mode in FIG. 6B, while FIG. 6A illustrates the narrow-angle emitted light 102 being provided during the first mode. The first view zone I and second view zone II are also illustrated.

As illustrated in FIGS. 6A-6B, a narrow-angle emitter 114 of the narrow-angle emitter array comprising an active optical emitter configured to provide the narrow-angle emitted light 102. Further, a bidirectional emitter 124 of the bidirectional emitter array comprises a pair of active optical emitters, as illustrated in FIGS. 6A-6B. In various embodiments, a first optical active emitter of the active optical emitter pair is configured to provide the first segment 106*a* of the bidirectional emitted light 106 and a second active optical emitter of the active optical emitter pair is configured to provide the second segment 106*b* of the bidirectional emitted light 106, e.g., as illustrated.

According to some embodiments, an active optical emitter of one or both of the narrow-angle emitter 114 and the bidirectional emitter 124 may comprise a micro light emitting diode (microLED or μLED). Herein, μLED is defined as a microscopic light emitting diode (LED), i.e., an LED having microscopic dimensions. In some embodiments, the μLED may comprise a plurality of μLEDs. According to some embodiments, the active emitter may comprise an organic light emitting diode (OLED). As defined herein, an OLED is an emitter having an emissive electroluminescent film or layer comprising an organic compound configured to emit light in response to an electric current or similar electrical stimulus. In other embodiments, another type of optical emitter may be used as the active optical emitter such as, but not limited to, an LED, a high intensity LED, and a quantum dot LED.

In some embodiments, the active optical emitter of one or both of the narrow-angle emitter 114 and the bidirectional emitter 124 may be configured to provide light that is substantially monochromatic having a particular color (i.e., the light may include a particular wavelength of light). In other embodiments, the active optical emitter may be configured to provide polychromatic light such as, but not limited to, white light, that includes a plurality or range of wavelengths. For example, active optical emitter may be configured to provide one or more of red light, green light, blue light, or a combination thereof. In another example, the active optical emitter may be configured to provide light that is substantially white light (i.e., the active optical emitter may be a white μLED or white OLED). In some embodiments, the active optical emitter may include a micro-lens, a diffraction grating, or another optical film or component configured to provide one or more of collimation (e.g., according to a collimation factor), polarization control, and a direction of light emitted by the active optical emitter. Active optical emitters of one or both of the narrow-angle emitter 114 and the bidirectional emitter 124 may be independently controlled, activated, or powered to one or both of provide local dimming and switch between modes, according to some embodiments.

In some embodiments, the active optical emitters may be supported by a substrate, e.g., a substrate of the first and second directional backlights 110, 120. In some embodiments (as illustrated in FIGS. 6A-6B), the first directional backlight 110 is configured to provide the narrow-angle emitted light 102 from a first surface and the second directional backlight 120 is adjacent to a second surface of the first directional backlight 110 opposite to the first surface, the first directional backlight 110 being transparent to the bidirectional emitted light 106. Transparency may be provided by a combination of a substantially transparent substrate and a relative spacing between and size of the narrow-angle emitters 114 of the narrow-angle emitter array. Further, as with the passive optical emitters described above, the active optical emitters of one or both of the narrow-angle emitter array and the bidirectional emitter array may be arranged either as 1D or 2D arrays.

Figure 7:
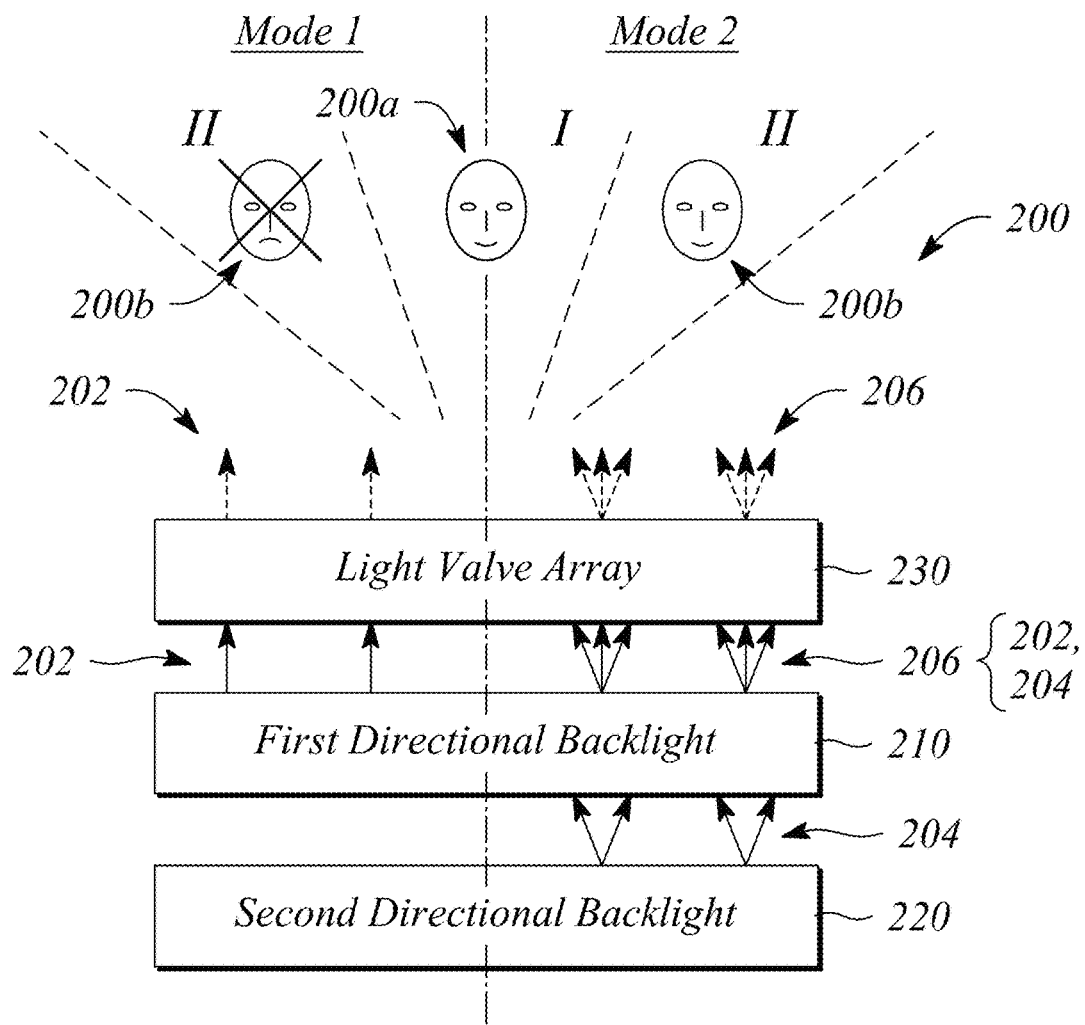
FIG. 7 illustrates a block diagram of a mode-switchable privacy display in an example, according to an embodiment consistent with the principles described herein.

In accordance with some embodiments of the principles described herein, a mode-switchable privacy display is provided. According to various embodiments, the mode-switchable privacy display is configured to provide a private displayed image during a first or privacy mode and to provide a public displayed image during a second or public mode. FIG. 7 illustrates a block diagram of a mode-switchable privacy display 200 in an example, according to an embodiment consistent with the principles described herein. Operation of the mode-switchable privacy display 200 in the privacy mode (Mode 1) is illustrated in a left half of FIG. 7, while a right half illustrates operation in the public mode (Mode 2).

According some embodiments, the private displayed image is configured to be visible in a private view zone I and the public displayed image is configured to be visible in a public view zone II that includes the private view zone I. In particular, a viewer 200*a* located in the private view zone I may be able to see both the private displayed image in the privacy mode and the public display image in the public mode. Similarly, another viewer 200*b* located in the public view zone II, but outside of the private view zone I may be able to see the public displayed image during the public mode, as illustrated. However, the mode-switchable privacy display 200 may appear dark and the private displayed image may not be visible to the other viewer 200*b* during the privacy mode, according to various embodiments. As such, the mode-switchable privacy display 200 may be selectively switched between privacy mode and public mode depending on whether the displayed image is intended to be viewed privately by the viewer 200*a* in the private view zone I or is meant to be viewed publically, e.g., by both the viewer 200*a*, 200*b* located substantially anywhere in the public view zone II that includes the private view zone I.

As illustrated, the mode-switchable privacy display 200 comprises a first directional backlight 210. The first directional backlight 210 comprises an array of narrow-angle emitters configured to provide narrow-angle emitted light 202 during both a privacy mode (Mode 1) and a public mode (Mode 2). The mode-switchable privacy display 200 further comprises a second directional backlight 220. The second directional backlight 220 comprises an array of bidirectional emitters configured to provide bidirectional emitted light 204 exclusively during the public mode (Mode 2). In various embodiments, the bidirectional emitted light 204 has a bifurcated angular extent that is complementary to the narrow-angle emitted light 202. During the public mode, mode-selectable privacy display is configured to provide broad-angle emitted light comprising a combination of the narrow-angle emitted light 202 provided by the first directional backlight 210 and the bidirectional emitted light 204 provided by the second directional backlight 220, according to various embodiments.

The mode-switchable privacy display 200 illustrated in FIG. 7 further comprises an array of light valves 230. The array of light valves 230 is configured to modulate the narrow-angle emitted light 202 as a private displayed image during the privacy mode. Further, the array of light valves 230 is configured to modulate the broad-angle emitted light 206 as a public displayed image during the public mode. In some embodiments (as illustrated), the first directional backlight 210 is between the second directional backlight 220 and the array of light valves 230, the first directional backlight 210 being transparent to the bidirectional emitted light 204. In various embodiments, different types of light valves may be employed as light valves 230 of the light valve array including, but not limited to, one or more of liquid crystal light valves, electrophoretic light valves, and light valves based on electrowetting. Modulated narrow-angle emitted light 202 and broad-angle emitted light 206 are illustrated using dashed line arrows to emphasize the modulation.

According to some embodiments, the first directional backlight 210 of the mode-switchable privacy display 200 may be substantially similar to the first directional backlight 110 of the mode-switchable backlight 100, described above. In particular, in some embodiments where the narrow-angle emitters of the narrow-angle emitter array are passive optical emitters as described with respect to FIGS. 2A-2B, the first directional backlight 210 may comprise a light guide configured to guide light from a light source along a length of the light guide as guided light. Further, the array of narrow-angle emitters of first directional backlight 210 may comprise an array of unilateral scattering elements configured to scatter out a portion of the guided light as the narrow-angle emitted light 202 having a unilateral direction. The unilateral direction may be toward the array of light valves 230 and away from second directional backlight 220, according to various embodiments. In some embodiments, a unilateral scattering element of the array of unilateral scattering elements may comprise one or both of a slanted diffraction grating and a reflection mode diffraction grating to provide the unilateral scattering. In other embodiments, other unilateral scattering elements may be employed. The first directional backlight 210 may further comprise the light source and more specifically a collimated light source configured to provide light to be guided as the guided light within the light guide, according to some embodiments.

In other embodiments, the narrow-angle emitter array may comprise active optical emitters configured to provide the narrow-angle emitted light 202. In some embodiments, a narrow-angle emitter of the narrow-angle emitter array may comprise an active optical emitter substantially similar to active optical emitter of the narrow-angle emitter 114, described above with respect to FIGS. 6A-6B. For example, the active optical emitter of the narrow-angle emitter may comprise an LED such as, but not limited to, a μLED, an OLED, and a high intensity LED, also as described above.

In some embodiments, the second directional backlight 220 of the mode-switchable privacy display 200 may be substantially similar to the second directional backlight 120 of the above-described mode-switchable backlight 100. In particular, where the bidirectional emitters of the bidirectional emitter array are passive optical emitters as described with respect to FIGS. 2A-2B, the second directional backlight 220 may comprise a light guide configured to guide light from a light source along a length of the light guide as guided light. Further, a bidirectional emitter of bidirectional emitter array of the second directional backlight 220 may comprise a first directional scattering element configured to scatter out a portion of the guided light as a first segment of the bidirectional emitted light 204 having a first direction of the bifurcated angular extent. Further, the bidirectional emitter may comprise a second directional scattering element configured to scatter out another portion of the guided light as a second segment of the bidirectional emitted light 204 having a second direction of the bifurcated angular extent. According to various embodiments, the first and second directions in combination with an angular range of the first and second segments determine the bifurcated angular extent of the bidirectional emitted light 204.

In other embodiments, bidirectional emitter array may comprise active optical emitters configured to provide the bidirectional emitted light 204. In particular, a bidirectional emitter of the bidirectional emitter array may be substantially similar to the bidirectional emitter 124 comprising active optical emitters, also described above with respect to FIG. 6A-6B, according to some embodiments. For example, a bidirectional emitter of the bidirectional emitter array may comprise a pair of active optical emitters, a first active optical emitter of the active optical emitter pair being configured to provide a first segment of the bidirectional emitted light 204 and a second active optical emitter of the active optical emitter pair being configured to provide a second segment of the bidirectional emitted light 204. The active optical emitter(s) of the bidirectional emitter may comprise an LED such as, but not limited to, a μLED, an OLED, and a high intensity LED, also as described above.

In accordance with other embodiments of the principles described herein, a method of mode-switchable backlight operation is provided. FIG. 7 illustrates a flow chart of a method 300 of mode-switchable backlight operation in an example, according to an embodiment consistent with the principles described herein. As illustrated in FIG. 7, the method 300 of mode-switchable backlight operation comprises emitting 310 narrow-angle emitted light using an array of narrow-angle emitters during both a first mode and a second mode using a first directional backlight to illuminate a first view zone. According to some embodiments, the first directional backlight may be substantially similar to the first directional backlight 110, described above with respect to the mode-switchable backlight 100. Further, the narrow angle emitted light may be substantially similar to the narrow-angle emitted light 102 provided by the first directional backlight 110.

In some embodiments, such as when narrow-angle emitters of the narrow-angle emitter array comprise passive optical emitters, emitting 310 narrow-angle emitted light may comprise guiding light along a length of a light guide as guided light. Emitting 310 narrow-angle emitted light may further comprise scattering out a portion of the guided light using the narrow-angle emitters comprising an array of unilateral scattering elements spaced apart from one another along the light guide length. The array of unilateral scattering elements may be configured to scatter out the portion of the guided light as the narrow-angle emitted light having a unilateral direction, according to some embodiments. The light guide and array of unilateral scattering element may be substantially similar to the above-described light guide 112 and array of unilateral scattering elements described above with respect to FIGS. 2A-2B, in some embodiments.

In other embodiments, such as when the narrow-angle emitters of the narrow-angle emitter array comprise narrow-angle active optical emitters, emitting 310 narrow-angle emitted light may comprise activating the narrow-angle active optical emitters of the narrow-angle emitter array. The narrow-angle active optical emitters may be activated during both the first and second mode, for example. In some embodiments, the narrow-angle active optical emitters may be substantially similar to the active optical emitters of the narrow-angle emitters 114 described above with reference to FIGS. 6A-6B.

Figure 8:
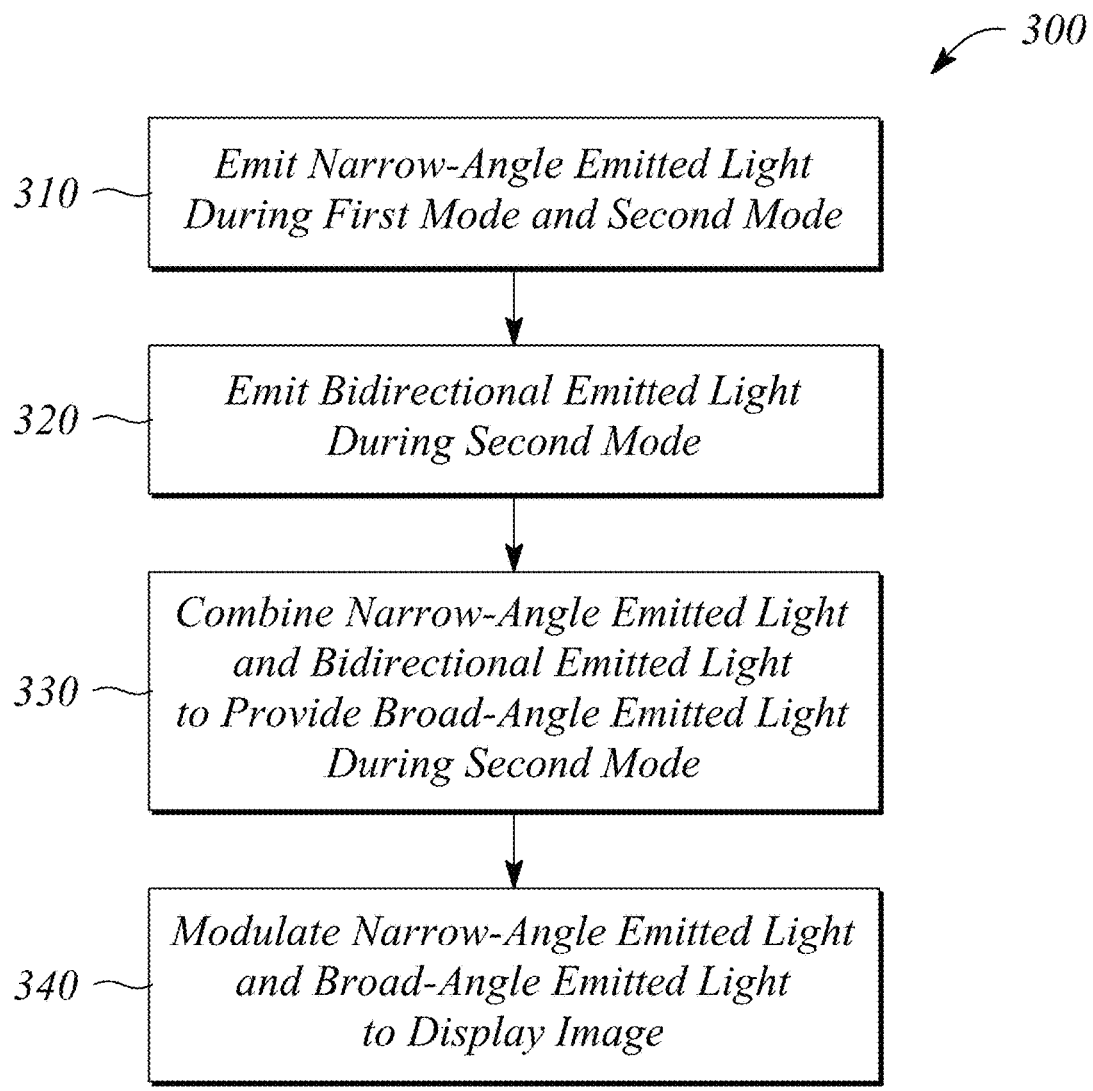
FIG. 8 illustrates a flow chart of a method of mode-switchable backlight operation in an example, according to an embodiment consistent with the principles described herein.

As illustrated in FIG. 8, the method 300 of mode-switchable backlight operation further comprises emitting 320 bidirectional emitted light using an array of bidirectional emitters exclusively during the second mode using a second directional backlight. According to various embodiments, the bidirectional emitted light has a bifurcated angular extent that is complementary to the narrow-angle emitted light. In some embodiments, the second directional backlight and bidirectional emitted light may be substantially similar respectively to the second directional backlight 120 and the bidirectional emitted light 106 described above with respect to the mode-switchable backlight 100.

In some embodiments, such as when bidirectional emitters of the narrow-angle emitter array comprise passive optical emitters, emitting 320 bidirectional emitted light comprises guiding light along a length of a light guide as guided light. The light guide may be substantially similar to the light guide 122 of the second directional backlight 120 illustrated in FIGS. 2A-2B, in some embodiments. In these embodiments, emitting 320 bidirectional emitted light further comprises scattering out a portion of the guided light using the passive optical emitters of the bidirectional emitter array. In particular, emitting 320 may comprise scattering out a portion of the guided light using a first plurality of directional scattering elements configured to scatter out a portion of the guided light as a first segment of the bidirectional emitted light having a first direction of the bifurcated angular extent. Emitting 320 bidirectional emitted light in these embodiments further comprises scattering out another portion of the guided light using a second plurality of directional scattering elements configured to scatter out the portion of the guided light as a second segment of the bidirectional emitted light having a second direction of the bifurcated angular extent. In some embodiments, the first and second pluralities of directional scattering elements may be substantially similar to pluralities of the first and second directional scattering elements 124a, 124b, of the above-described second directional backlight 120 illustrated in FIGS. 2A-2B. Likewise, the first and second segments of the bidirectional emitted light may be substantially similar to the above-described first and second segments 106a, 106b of the bidirectional emitted light 106. In particular, the first and second directions in combination with an angular range of the first and second segments determine the bifurcated angular extent of the bidirectional emitted light.

In other embodiments, such as when the bidirectional emitters of the bidirectional emitter array comprise pairs of directional active optical emitters, emitting bidirectional emitted light comprises activating the pairs of directional active optical emitters. The directional active optical emitters may be activated during only the second mode, for example, to provide the bidirectional emitted light. In some embodiments, the directional active optical emitters may be substantially similar to the active optical emitters of the bidirectional emitters 124 described above with reference to FIGS. 6A-6B.

The method 300 of mode-switchable backlight operation illustrated in FIG. 8 further comprises combining 330 the narrow-angle emitted light and the bidirectional emitted light during the second mode to provide broad-angle emitted light. In various embodiments, the broad-angle emitted light illuminates a second view zone that includes the first view zone. Further, the narrow-angle emitted light exclusive illuminates the first view zone. As such, in the first mode, only the first view zone is illuminated, according to various embodiments.

In some embodiments (e.g., as illustrated in FIG. 8), the method 300 of mode-switchable backlight operation further comprises modulating 340 the narrow-angle emitted light and the broad-angle emitted light using an array of light valves to display an image. The displayed image is a private displayed image during the first mode or privacy mode and a public displayed image during the second mode or public mode. Further, the private image has a viewing range limited by the angular range of the narrow-angle emitted light. That is, the private displayed image may be visible only within the first view zone. On the other hand, the public displayed image is visible in the second view zone having a wide angular range that includes the first view zone, according to various embodiments. In some embodiments, the array of light valves may be substantially similar to the array of light valves 230 described above with respect to the mode-switchable privacy display 200. Further, the private display image and public display image may be substantially similar to the private and public displayed images also described above with respect to the mode-switchable privacy display 200.

Thus, there have been described examples and embodiments of a mode-switchable backlight, a mode-switchable privacy display, and a method of mode-switchable backlight operation that employ a switchable combination of narrow-angle emitted light in a first mode and broad-angle emitted light comprising the narrow-angle emitted light and bidirectional emitted light in a second mode. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A mode-switchable backlight comprising
a first directional backlight comprising an array of narrow-angle emitters configured to provide narrow-angle emitted light during both a first mode and a second mode; and
a second directional backlight comprising an array of bidirectional emitters configured to provide bidirectional emitted light exclusively during the second mode, the bidirectional emitted light having a bifurcated angular extent that is complementary to an angular range of the narrow-angle emitted light,
wherein a combination of the narrow-angle emitted light and the bidirectional emitted light during the second mode is configured to provide broad-angle emitted light having an angular range that is a summation of the angular range of the narrow-angle emitted light and the bifurcated angular extent of the bidirectional emitted light, and
wherein a bidirectional emitter of the bidirectional emitter array comprises a pair of active optical emitters, a first active optical emitter of the active optical emitter pair being configured to provide a first segment of the bidirectional emitted light and a second active optical emitter of the active optical emitter pair being configured to provide a second segment of the bidirectional emitted light.

2. The mode-switchable backlight of claim 1, wherein the narrow-angle emitted light is configured to provide illumination exclusively to a first view zone during the first mode, the broad-angle emitted light being configured to provide illumination to a second view zone that includes the first view zone during the second mode.

3. The mode-switchable backlight of claim 1, wherein a bidirectional emitter of the bidirectional emitter array is aligned with a corresponding narrow-angle emitter of the narrow-angle emitter array, the bidirectional emitter and the corresponding narrow-angle emitter cooperatively providing the broad-angle emitted light during the second mode.

4. The mode-switchable backlight of claim 1, wherein a narrow-angle emitter of the narrow-angle emitter array comprises an active optical emitter configured to provide the narrow-angle emitted light.

5. The mode-switchable backlight of claim 1, wherein the first directional backlight is configured to provide the narrow-angle emitted light from a first surface and the second directional backlight is adjacent to a second surface of the first directional backlight opposite to the first surface, the first directional backlight being transparent to the bidirectional emitted light.

6. A mode-switchable privacy display comprising the mode-switchable backlight of claim 1, the display further comprising an array of light valves configured to modulate the narrow-angle emitted light as a private displayed image during the first mode and to modulate the broad-angle emitted light as a public displayed image during the second mode, a viewing range of the private displayed image being limited by the angular range of the narrow-angle emitted light,
wherein the first mode is a privacy mode and the second mode is a public mode of the mode-switchable privacy display.

7. A mode-switchable privacy display comprising:
a first directional backlight comprising an array of narrow-angle emitters configured to provide narrow-angle emitted light during both a privacy mode and a public mode;
a second directional backlight comprising an array of bidirectional emitters configured to provide bidirectional emitted light exclusively during the public mode, the bidirectional emitted light having a bifurcated angular extent that is complementary to an angular range of the narrow-angle emitted light; and
an array of light valves configured to modulate the narrow-angle emitted light as a private displayed image during the privacy mode and to modulate broad-angle emitted light as a public displayed image during the public mode, the broad-angle emitted light comprising a combination of the narrow-angle emitted light and the bidirectional emitted light during the public mode,
wherein the private displayed image is configured to be visible in a private view zone and the public displayed image is configured to be visible in a public view zone that includes the private view zone, and
wherein a narrow-angle emitter of the narrow-angle emitter array comprise an active optical emitter configured to provide the narrow-angle emitted light, and wherein a bidirectional emitter of the bidirectional emitter array comprises a pair of active optical emitters, a first active optical emitter of the active optical emitter pair being configured to provide a first segment of the bidirectional emitted light and a second active optical emitter of the active optical emitter pair being configured to provide a second segment of the bidirectional emitted light.

8. The mode-switchable privacy display of claim 7, wherein one or both of the active optical emitter of the narrow-angle emitter and the pair of active optical emitters of the bidirectional emitter comprise a light emitting diode.

9. The mode-switchable privacy display of claim 7, wherein the first directional backlight is between the second directional backlight and the array of light valves, the first directional backlight being transparent to the bidirectional emitted light.

10. A method of mode-switchable backlight operation, the method comprising:
emitting narrow-angle emitted light using an array of narrow-angle emitters during both a first mode and a second mode using a first directional backlight to illuminate a first view zone;
emitting bidirectional emitted light using an array of bidirectional emitters exclusively during the second mode using a second directional backlight, the bidirectional emitted light having a bifurcated angular extent that is complementary to an angular range of the narrow-angle emitted light; and
combining the narrow-angle emitted light and the bidirectional emitted light during the second mode to provide broad-angle emitted light,
wherein the broad-angle emitted light illuminates a second view zone that includes the first view zone, and wherein a bidirectional emitter of the bidirectional emitter array comprises a pair of active optical emitters, a first active optical emitter of the active optical emitter pair being configured to provide a first segment of the bidirectional emitted light and a second active optical emitter of the active optical emitter pair being configured to provide a second segment of the bidirectional emitted light.

11. The method of mode-switchable backlight operation of claim 10, wherein the array of narrow-angle emitters comprises narrow-angle active optical emitters and emitting narrow-angle emitted light comprises activating the narrow-angle active optical emitters of the narrow-angle emitter array.

12. The method of mode-switchable backlight operation of claim 10, wherein emitting bidirectional emitted light comprises activating the first and second active optical emitters of the active optical emitter pair.

13. The method of mode-switchable backlight operation of claim 10, further comprising modulating the narrow-angle emitted light and the broad-angle emitted light using an array of light valves to display an image, wherein the displayed image is a private displayed image during the first mode and a public displayed image during the second mode, the private displayed image having a viewing range limited by the angular range of the narrow-angle emitted light, wherein the private displayed image is visible in the first viewing zone and the public displayed image is visible in the second viewing zone that includes the first viewing zone.

* * * * *